United States Patent
Kim et al.

(10) Patent No.: US 7,045,875 B2
(45) Date of Patent: May 16, 2006

(54) SEMICONDUCTOR DEVICE WITH SELF-ALIGNED JUNCTION CONTACT HOLE AND METHOD OF FABRICATING THE SAME

(75) Inventors: Ji-Young Kim, Kyunggi-do (KR); Je-Min Park, Kyunggi-do (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 0 days.

(21) Appl. No.: 11/009,913

(22) Filed: Dec. 10, 2004

(65) Prior Publication Data

US 2005/0098850 A1 May 12, 2005

Related U.S. Application Data

(62) Division of application No. 10/624,270, filed on Jul. 21, 2003, now Pat. No. 6,852,620.

(30) Foreign Application Priority Data

Jul. 26, 2002 (KR) ............................. 2002-44223

(51) Int. Cl.
*H01L 21/76* (2006.01)

(52) U.S. Cl. ...................... 257/510; 257/510; 257/513
(58) Field of Classification Search .............. 257/510, 257/513, 515, 520
See application file for complete search history.

(56) References Cited

U.S. PATENT DOCUMENTS

| 6,057,581 A | * | 5/2000 | Doan ......................... 257/401 |
| 6,432,816 B1 | | 8/2002 | Kim et al. |
| 6,617,216 B1 | | 9/2003 | Hu |

FOREIGN PATENT DOCUMENTS

JP        11-074526        3/1999

OTHER PUBLICATIONS

English language abstract of Japanese Publication No. 11-074526.

* cited by examiner

*Primary Examiner*—David Nelms
*Assistant Examiner*—Thinh T Nguyen
(74) *Attorney, Agent, or Firm*—Marger Johnson & McCollom, P.C.

(57) ABSTRACT

A plurality of trenches for defining active regions are formed in a semiconductor substrate, using a plurality of trench masks. A gap fill insulating layer is formed on the resulting structure to fill a gap region bounded by the trench and the trench masks. Next, the trench mask and the gap fill insulating layer are patterned to form a trench mask pattern and a gap fill insulating pattern for defining a slit-type opening, extending across and exposes the active region. A gate pattern is formed in the slit-type opening and the trench mask pattern is removed to form a contact opening exposing the active region. Next, a contact plug is formed to fill the contact opening. Here, the contact opening is self-alignedly formed using an etch selectivity between the trench mask and the gap fill insulating layer. The resulting contact opening is a vacancy in a rectangular parallelepiped shape.

14 Claims, 25 Drawing Sheets

SEMICONDUCTOR DEVICE WITH SELF-ALIGNED JUNCTION CONTACT HOLE AND METHOD OF FABRICATING THE SAME

RELATED APPLICATION

This application is a Divisional of U.S. Ser. No. 10/624,270, filed on Jul. 21, 2003 now U.S. Pat. No. 6,852,620, now pending, which claims priority from Korean Patent Application No. 2002-44223, filed on Jul. 26, 2002, both of which are herein incorporated by reference in their entirety.

FIELD OF THE INVENTION

The present invention relates to semiconductor devices and methods of fabricating the same. More specifically, the present invention is directed to a semiconductor device with a self-aligned junction contact hole and a method of fabricating the same.

BACKGROUND OF THE INVENTION

As the integration density of semiconductor devices has increased, the semiconductor devices are becoming gradually finer. The fine semiconductor devices are formed by repeatedly depositing and patterning material layers. In general, the patterning process comprises a photolithographic process and an etching process, which are sequentially performed. The etching process uses a photoresist pattern, formed during the photolithographic process, as an etch mask. Here, to enhance the integration density of a semiconductor device, the photoresist pattern should be finely formed and overlay accuracy should be improved. In particular, a junction contact hole for electrically connecting source/drains of semiconductor devices has an influence on the size of a unit cell. Thus, to achieve the high integration of semiconductor devices, it is imperative to increase the overlay accuracy during the step of patterning the junction contact hole.

In general, forming the junction contact hole comprises forming a device isolation layer for defining an active region on a semiconductor substrate, and forming a gate pattern on the active region to cross over the device isolation layer. Next, an interlayer dielectric (ILD) is formed to cover the entire surface of the semiconductor substrate including the gate pattern. The ILD is patterned to form a junction contact hole exposing the active region on a side of the gate pattern. As described above, the patterning process for forming the junction contact hole comprises forming a photoresist pattern and using the photoresist pattern as an etching mask. Here, the photoresist pattern should be aligned to the active region and the gate pattern with high overlay accuracy. If the junction contact hole deviates from a predetermined position while the junction contact hole is formed, the gate pattern or the device isolation layer may suffer from etching damages.

The etching damages can be prevented using techniques of sufficiently spacing the junction contact hole from the gate pattern or the device isolation layer. However, as the techniques lead the unit cell to occupy even an unnecessary area, they are not preferable in respect of the high integration of semiconductors. That is, to obtain the high integration necessary for the miniaturization of material patterns, the photolithographic process should have improved overlay accuracy as much as possible. However, although misalignment caused during the photolithographic process can be minimized, it cannot be completely solved with the conventional methods.

SUMMARY OF THE INVENTION

The present invention provides a method of fabricating a semiconductor device comprising forming a self-aligned junction contact hole.

The present invention also provides a semiconductor device with a self-aligned junction contact hole.

In accordance with an embodiment of the present invention, a method of fabricating a semiconductor device, which can form a self-aligned contact hole by using an etch selectivity between different material layers is provided. The method comprises forming a plurality of trench masks on a semiconductor substrate, and etching the semiconductor substrate by using the trench masks as etch masks to form a trench for defining an active region. Next, a gap fill insulating layer is formed to fill a gap region, which is made by the trench and the trench masks. Here, the gap fill insulating layer exposes a top surface of the trench mask. Next, the trench mask and the gap fill insulating layer are patterned until a top surface of the active region is exposed, thereby forming a trench mask pattern and a gap fill insulating pattern. The trench mask pattern and the gap fill insulating pattern define a slit-type opening extending across the active region. A gate pattern is formed in the slit-type opening, and then the trench mask pattern is removed to form a contact opening exposing the active region. Next, a contact plug is formed to fill the contact opening.

According to an embodiment of the present invention, the contact opening is formed into a self-aligned type by using the etch selectivity between the trench mask and the gap fill insulating layer. For this, the trench mask is formed of a material having an etch selectivity with respect to the gap fill insulating layer, preferably a silicon nitride layer. Also, the etching process for forming the trench is preferably an anisotropic etch process.

Meanwhile, before forming the gap fill insulating layer, the method may further comprise forming a trench oxide layer to cover the inner walls of the trench, and then forming a liner layer on the entire surface of the resultant structure. Here, the trench oxide layer is preferably a silicon oxide layer obtained by thermal oxidation, and the liner layer is preferably a silicon nitride layer.

Preferably, forming the gap fill insulating layer comprises forming an insulating layer for filling a gap region made by the trench and the trench masks on the entire surface of the semiconductor substrate where the trench is formed, and then planarizing the insulating layer until the trench mask is exposed. Here, the insulating layer may be a multiple layer obtained by several stacking and etching processes. Also, the gap fill insulating layer is preferably at least one of a silicon oxide layer formed using chemical vapor deposition (CVD) or spin coating, and a silicon layer formed using CVD or epitaxial growth.

The slit-type opening is formed using an anisotropic etch process. Here, the slit-type opening is formed such that a top surface of the gap fill insulating pattern formed on the trench has the same height as that of the exposed active region. Meanwhile, before forming the slit-type opening, the method may further comprise an ion implantation process for forming a well in the semiconductor substrate. Also, before forming the contact plug, the method may further comprise an ion implantation process for forming a source/drain in the active region, which is exposed via the contact opening.

Preferably, before forming the gate pattern, gate spacers are further formed on the inner sidewalls of the slit-type opening. Here, the gate spacers are formed of a material having an etch selectivity with respect to the trench mask pattern. Also, before forming the contact plug, opening spacers may be further formed on the inner sidewalls of the contact opening. Further, before forming the opening spacers, an isotropic etch process may be further performed to increase the width of the contact opening.

Meanwhile, the contact plug is preferably formed of a conductive layer containing silicon atoms by using epitaxial growth. Also, forming the contact plug preferably comprises forming a contact plug conductive layer to fill the contact opening, and then planarizing the contact plug conductive layer until a top surface of the gap fill insulating pattern is exposed.

Forming the gate pattern comprises sequentially stacking a gate insulating layer, a gate conductive pattern, and a capping insulating pattern on the active region, which is exposed via the slit-type opening. Here, the gate conductive pattern fills a bottom region of the slit-type opening, where the gate insulating layer is formed, and has a top surface lower than those of the trench mask pattern and the gap fill insulating pattern. Also, the capping insulating pattern fills a top region of the slit-type opening where the gate conductive pattern is formed. Here, the capping insulating pattern is formed of a material having an etch selectivity with respect to the trench mask pattern.

Meanwhile, before forming the capping insulating pattern, a gate interlayer insulating layer may further be formed to conformally cover the inner wall of the slit-type opening where the gate conductive pattern is formed. Further, the method may further comprise forming a gate upper conductive layer on the entire surface of the semiconductor substrate including the gate interlayer insulating layer to fill the slit-type opening, and then etching back the gate upper conductive layer to form a gate upper conductive pattern, of which top surface is lower than those of the trench mask pattern and the gap fill insulating pattern. The resulting gate pattern is typically used as a gate of a nonvolatile memory. Accordingly, the gate interlayer insulating layer is preferably an oxide-nitride-oxide (ONO) layer.

The gate conductive pattern is preferably formed using an etch back process. That is, to form the gate conductive pattern, a gate conductive layer is formed to fill the slit-type opening, and is then etched using an etch back process until a top surface of the gate conductive layer becomes lower than that of the slit-type opening. Here, the gate pattern is preferably covered with a material having an etch selectivity with respect to the trench mask pattern.

In accordance with another aspect of the present invention, a semiconductor device, in which a junction contact hole has a rectangular parallelepiped shape is provided. The device comprises a semiconductor substrate where a trench for defining an active region is formed, a gap fill insulating pattern for filling the trench and having a contact opening exposing the active region, and a contact plug connected to the active region via the contact opening. Here, the gap fill insulating pattern has a top surface higher than that of the active region and fills the trench. Also, the contact opening is a vacancy having a rectangular parallelepiped shape.

A gate pattern may be further disposed in the slit-type opening crossing the active region and the trench. Here, the slit-type trench is defined by the gap fill insulating pattern and sidewalls of the contact plugs. Also, a top surface of the gate pattern is as high as the top surface of the gap fill insulating pattern. The gap fill insulating pattern is preferably at least one selected from the group consisting of a silicon oxide layer, an SOG layer, and a silicon layer. Also, the contact plug may be either an epitaxial silicon layer or a polysilicon layer. Further, opening spacers may further be disposed between the contact opening and the contact plug.

Preferably, the gate pattern is formed of a gate insulating layer, a gate conductive pattern, and a capping pattern, which are sequentially stacked. Here, the capping pattern preferably has the same chemical composition as the gap fill insulating pattern. Also, gate spacers may further be disposed on sidewalls of the gate pattern to space apart the gate pattern from the contact plug and the gap fill insulating pattern.

Also, a gate interlayer insulating layer and a gate upper conductive pattern, which are sequentially stacked, may be further disposed between the gate conductive pattern and the capping pattern. The gate pattern is typically used as a gate of a nonvolatile memory device. For this, the gate interlayer insulating layer is preferably an oxide-nitride-oxide (ONO) layer, and may include a sidewall extension for covering sidewalls of the gate upper conductive pattern.

BRIEF DESCRIPTION OF THE DRAWINGS

FIGS. 1A through 8A are top plan views illustrating a method of fabricating a semiconductor device according to preferred embodiments of the present invention;

FIGS. 1B through 8B are cross-sectional views illustrating the method of fabricating the semiconductor device according to the preferred embodiments of the present invention;

FIGS. 1C through 8C are perspective views illustrating the method of fabricating the semiconductor device according to the preferred embodiments of the present invention.

DESCRIPTION OF THE PREFERRED EMBODIMENT

Figure 1A:
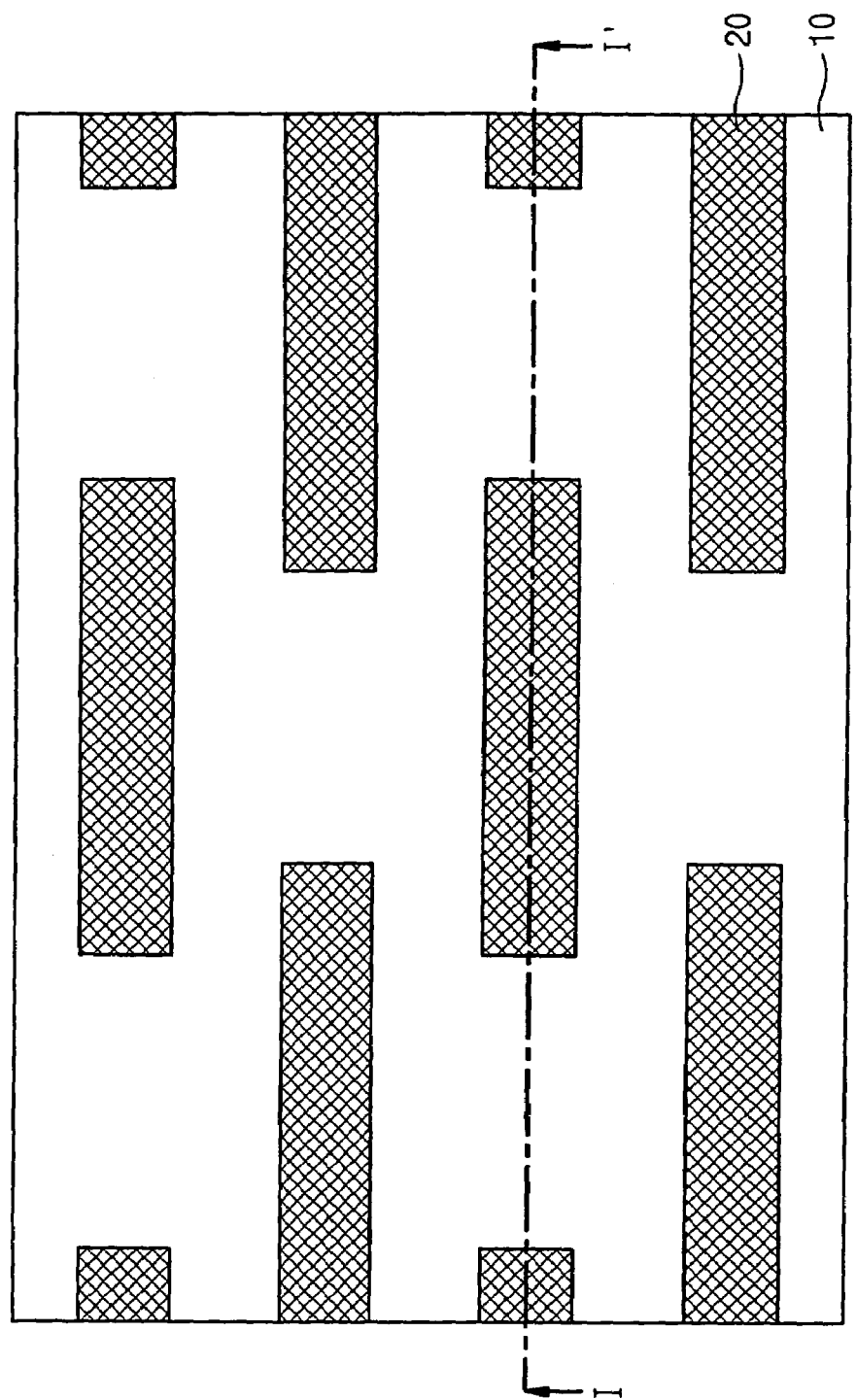

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It should also be understood that when a layer is referred to as being "on" another layer or substrate, it can either be directly on the other layer or substrate, or intervening layers may also be present between them. Like numbers refer to like elements throughout.

FIGS. 1A through 8A are top plan views illustrating a method of fabricating a semiconductor device according to preferred embodiments of the present invention. FIGS. 1B through 8B are cross-sectional views taken along the line I–I' of FIGS. 1A through 8A, illustrating the method of fabricating the semiconductor device according to the preferred embodiments of the present invention. Also, FIGS. 1C through 8C are perspective views illustrating the method of fabricating the semiconductor device according to the preferred embodiments of the present invention.

Figure 1B:
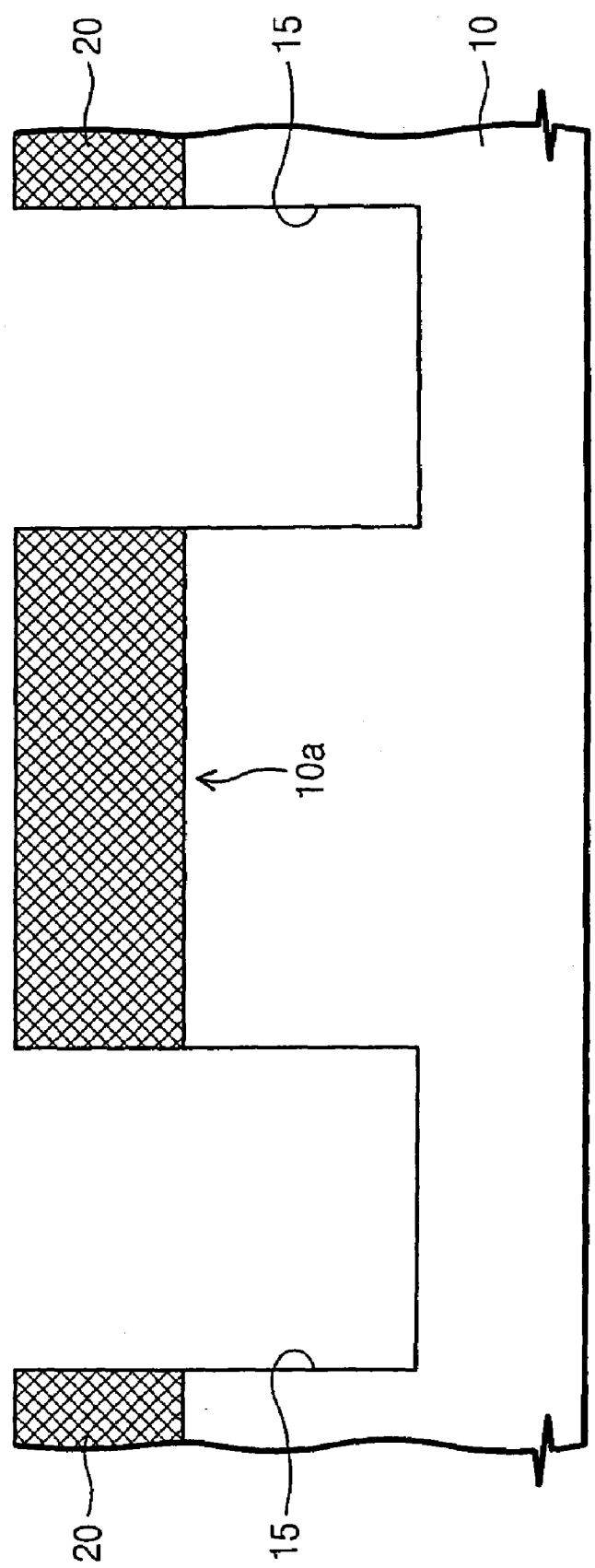
Figure 1C:
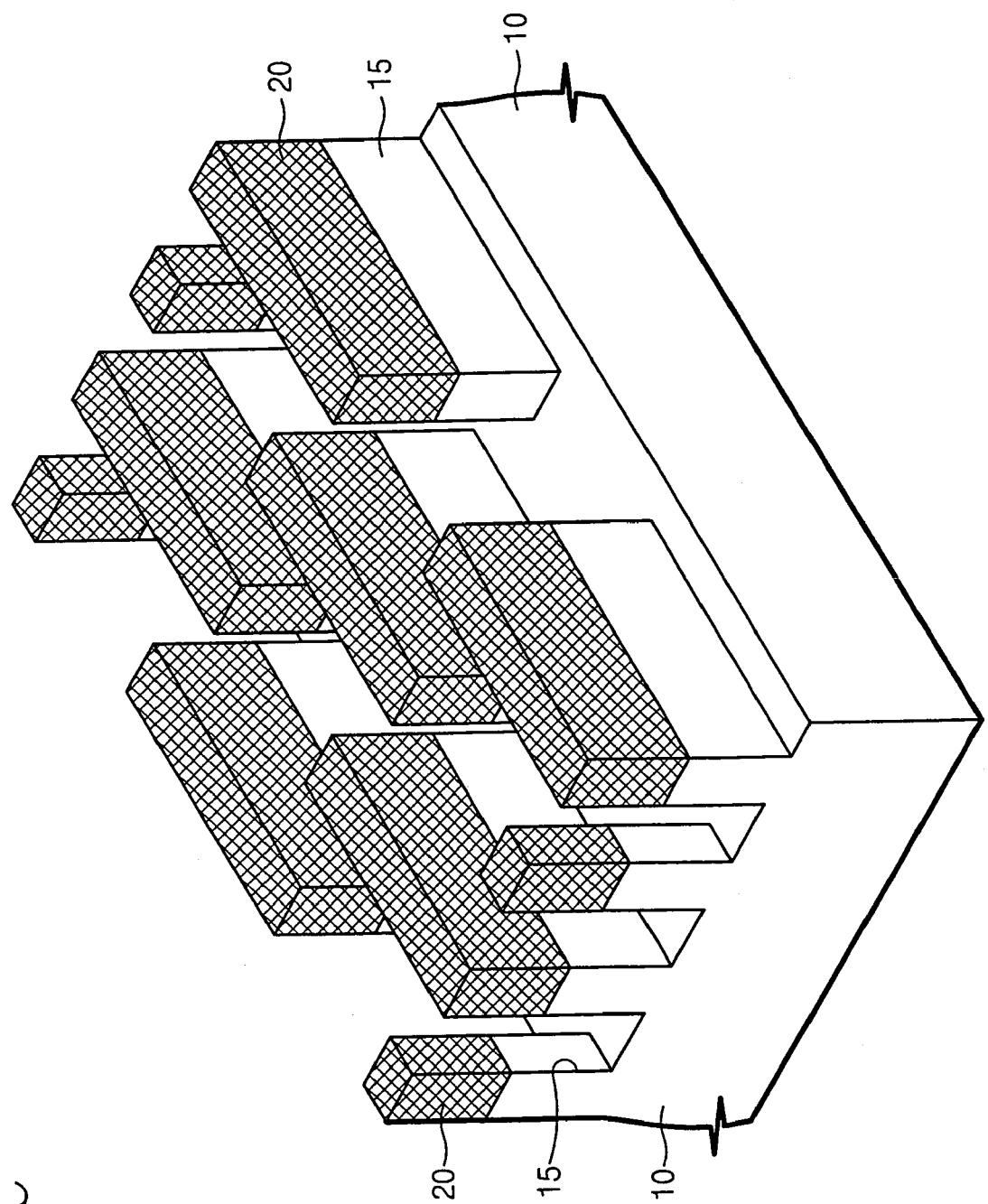

Referring to FIGS. 1A, 1B, and 1C, a trench mask layer is formed on a semiconductor substrate 10 and is patterned to form a plurality of trench masks 20, which expose a predetermined region of the semiconductor substrate 10. Next, the exposed substrate 10 is etched using the trench masks 20 as an etch mask, thereby forming a trench 15 defining the active region 10a. Here, the trench 15 is formed in the semiconductor substrate 10, and a gap region, which is surrounded by the trench masks 20, is formed over the trench 15 (see FIG. 1C).

The trench masks 20 are preferably formed of a pad oxide layer and a mask sacrificial layer, which are sequentially stacked. Here, the pad oxide layer is formed of a silicon oxide layer, and the mask sacrificial layer is formed of a silicon nitride layer.

The etching process for forming the trench 15 is preferably an anisotropic etching process. Meanwhile, the trench masks 20 will be used as a mold for gate patterns to be later formed. Thus, the height of the trench masks 20 determines the height of the subsequent gate patterns. Accordingly, the thickness of the trench masks 20 are formed in consideration of the height of the gate patterns to be formed during a subsequent process.

Figure 2A:
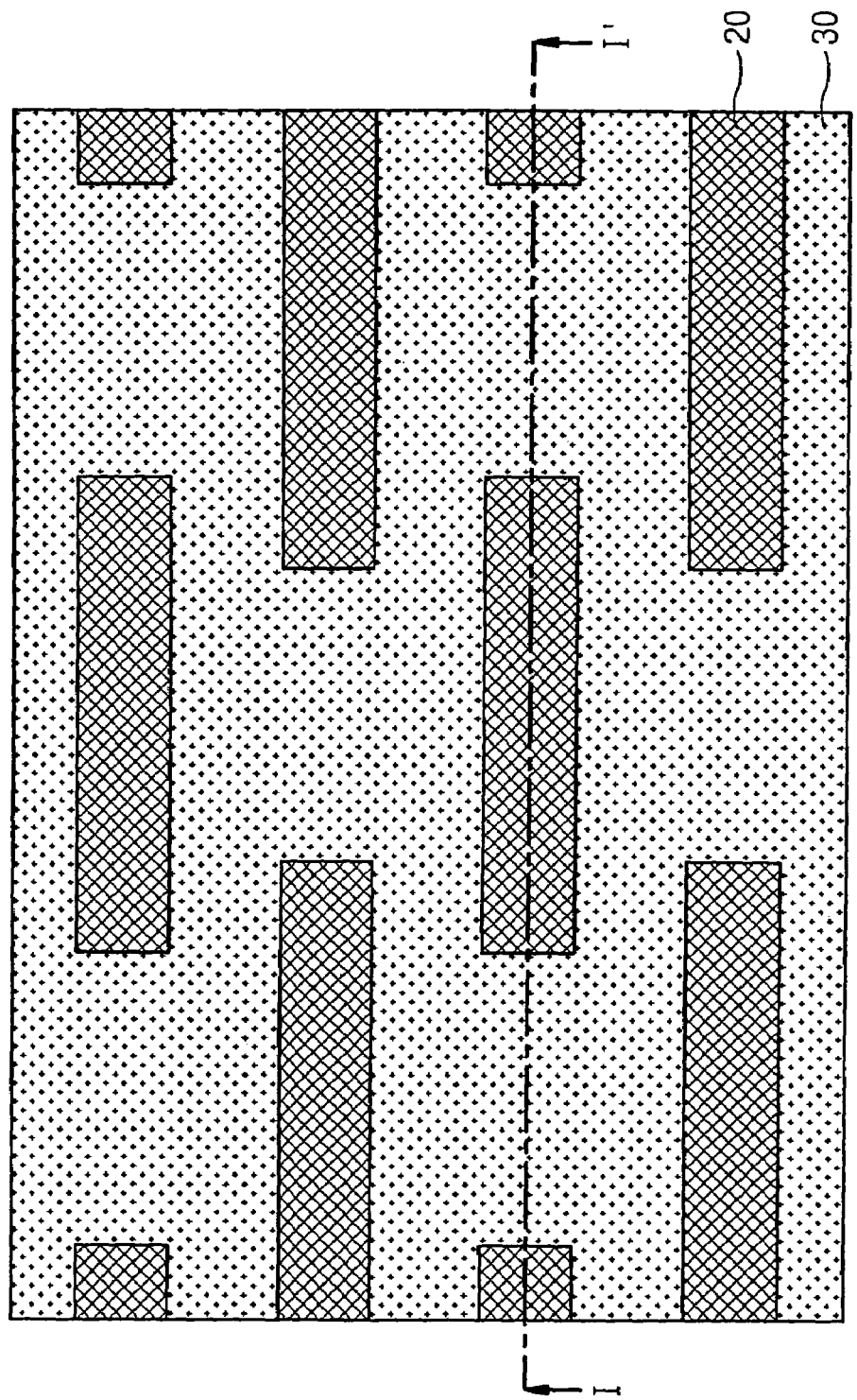
Figure 2B:
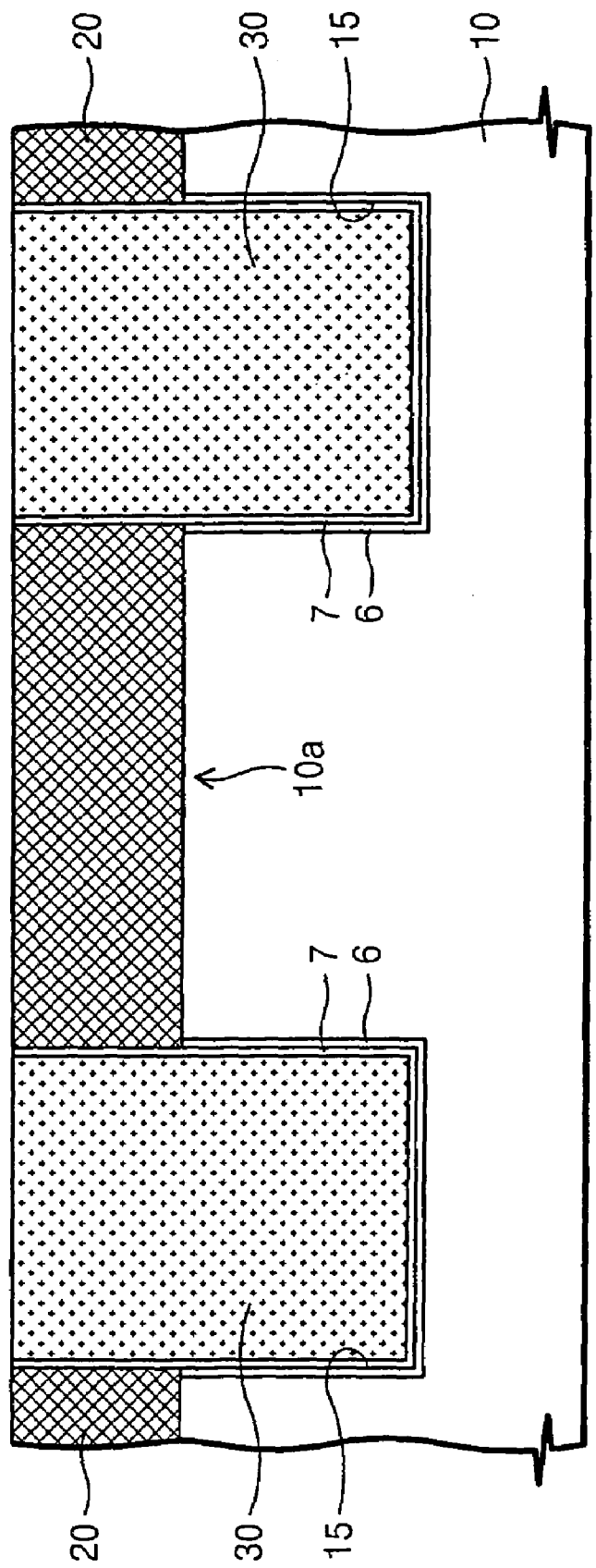
Figure 2C:
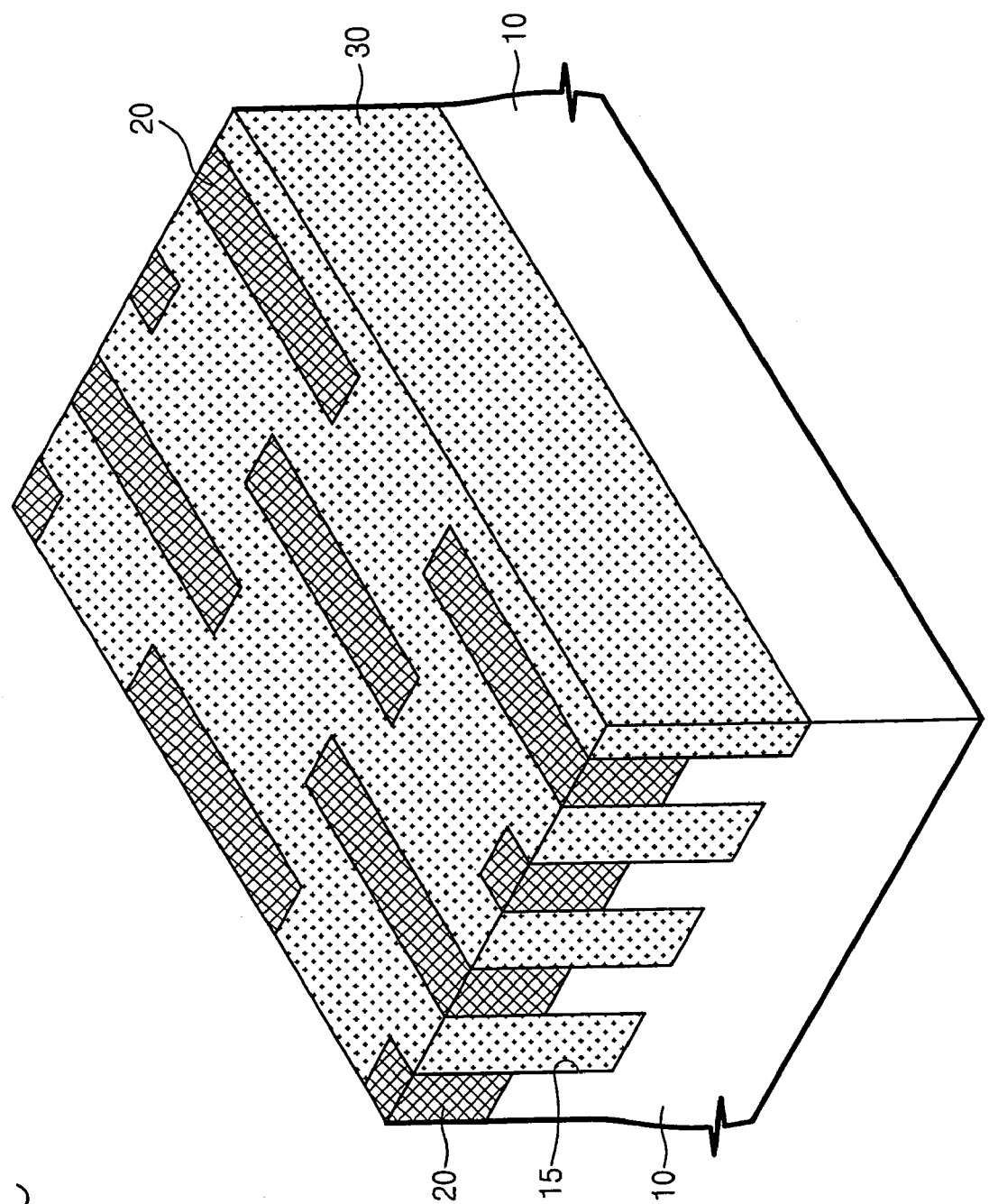

Referring to FIGS. 2A, 2B, and 2C, a gap fill insulating layer 30 is formed to fill a gap region made by the trench masks 20 as well as the trench 15. Forming the gap fill insulating layer 30 comprises forming an insulating layer for filling the gap region and the trench 15 on the semiconductor substrate including the trench 15, and then planarizing the insulating layer until top surfaces of the trench masks 20 are exposed. The planarizing process for forming the gap fill insulating layer 30 is preferably a chemical mechanical polishing (CMP) process. Thus, the gap fill insulating layer 30 fills the gap region and the trench 15 and has a top surface as high as the trench masks 20.

In the meantime, the etching process used for forming the trench 15 is typically an anisotropic etching process using plasma. Thus, inner walls of the trench 15 may suffer from etching damages caused by plasma. As the etching damages may degrade characteristics of the semiconductor device, it is preferable that a thermal process is further performed. The thermal process is preferably a trench thermal process, by which a thermal oxide layer (6 of FIG. 2B) is formed on the inner walls of the trench 15 before forming the gap fill insulating layer 30.

In addition, before forming the gap fill insulating layer 30, a liner layer is preferably formed to conformally cover the entire surface of the semiconductor substrate where the trench thermal oxide layer 6 is formed. The liner layer is etched together with the insulating layer during the planarizing process, thereby forming a liner (7 of FIG. 2B) encompassing the gap fill insulating layer 30. The liner is a material layer for preventing the penetration of oxygen or other impurities used during subsequent processes into the semiconductor substrate 10 through the inner walls of the trench 15. Accordingly, the liner 7 is preferably formed of a silicon nitride layer, which has excellent diffusion preventing characteristics.

The gap fill insulating layer 30 is formed of a material having an etch selectivity with respect to the trench masks 20. The gap fill insulating layer 30 is preferably formed of a silicon oxide layer, and a silicon layer may further be included. The silicon oxide layer may be formed using chemical vapor deposition (CVD) or spin coating, and the silicon layer may be formed using CVD or epitaxial growth. In particular, to achieve the high integration of the semiconductor device, the trench 15 and the gap region may require an aspect ratio, which is too difficult to complete in a single process for filling insulating layers. In this case, to fill the trench 15 and the gap region without a void, the stacking and etching processes are preferably performed several times. As a result, the gap fill insulating layer 30 has a multi-layered structure. In the preferred embodiment, an SOG layer or a silicon epitaxial layer is first formed on a bottom region of the trench 15 to decrease an aspect ratio of the gap region. Thereafter, the remaining gap region is filled with a silicon oxide layer obtained by an ordinary method. Here, the gap fill insulating layer 30 is disposed on the trench 15 and the gap region thereon, and the trench masks 20 are disposed on the active region 10a. Also, forming the silicon epitaxial layer may further comprise exposing a surface of the semiconductor substrate formed of silicon under the trench 15.

Figure 3A:
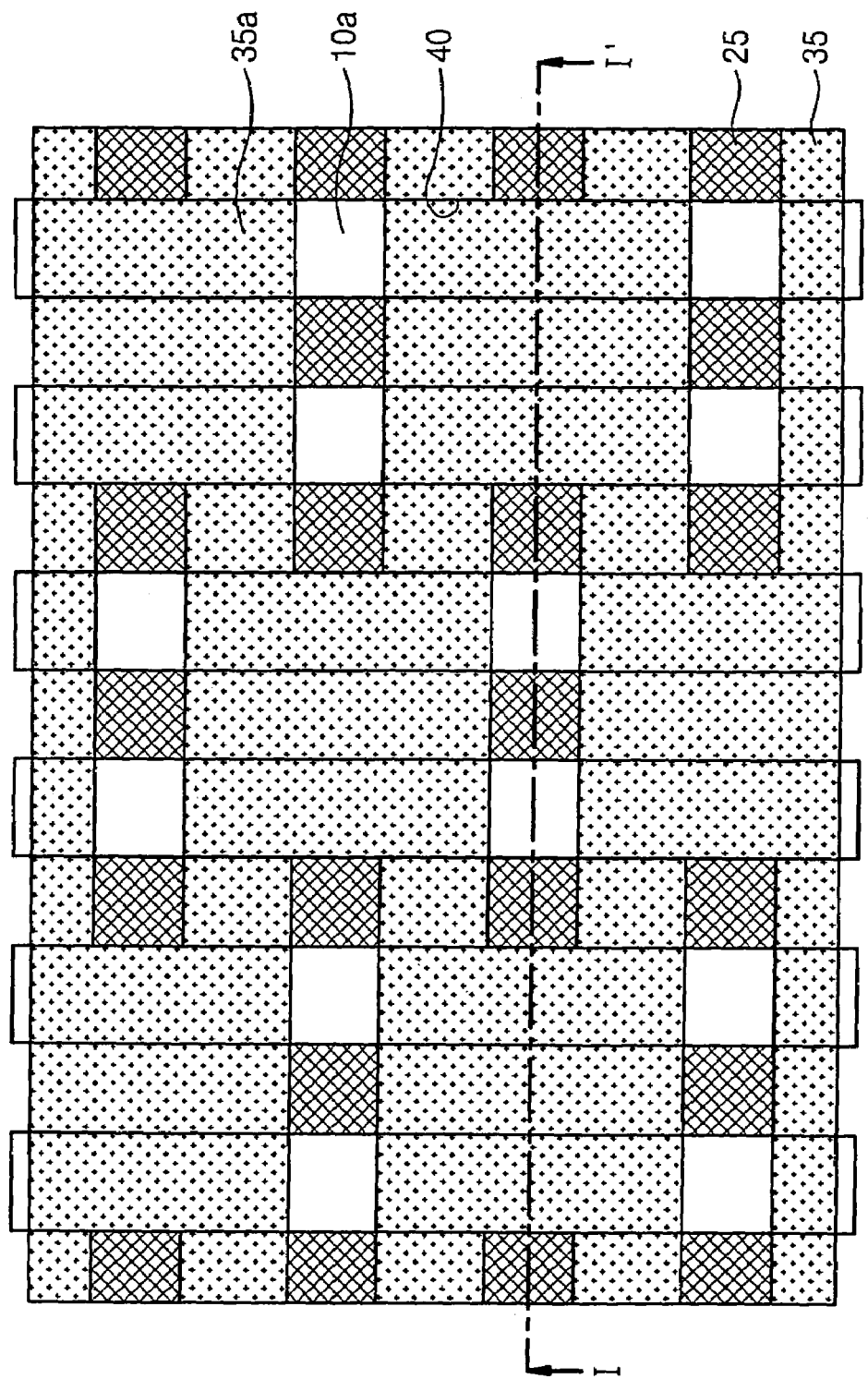
Figure 3B:
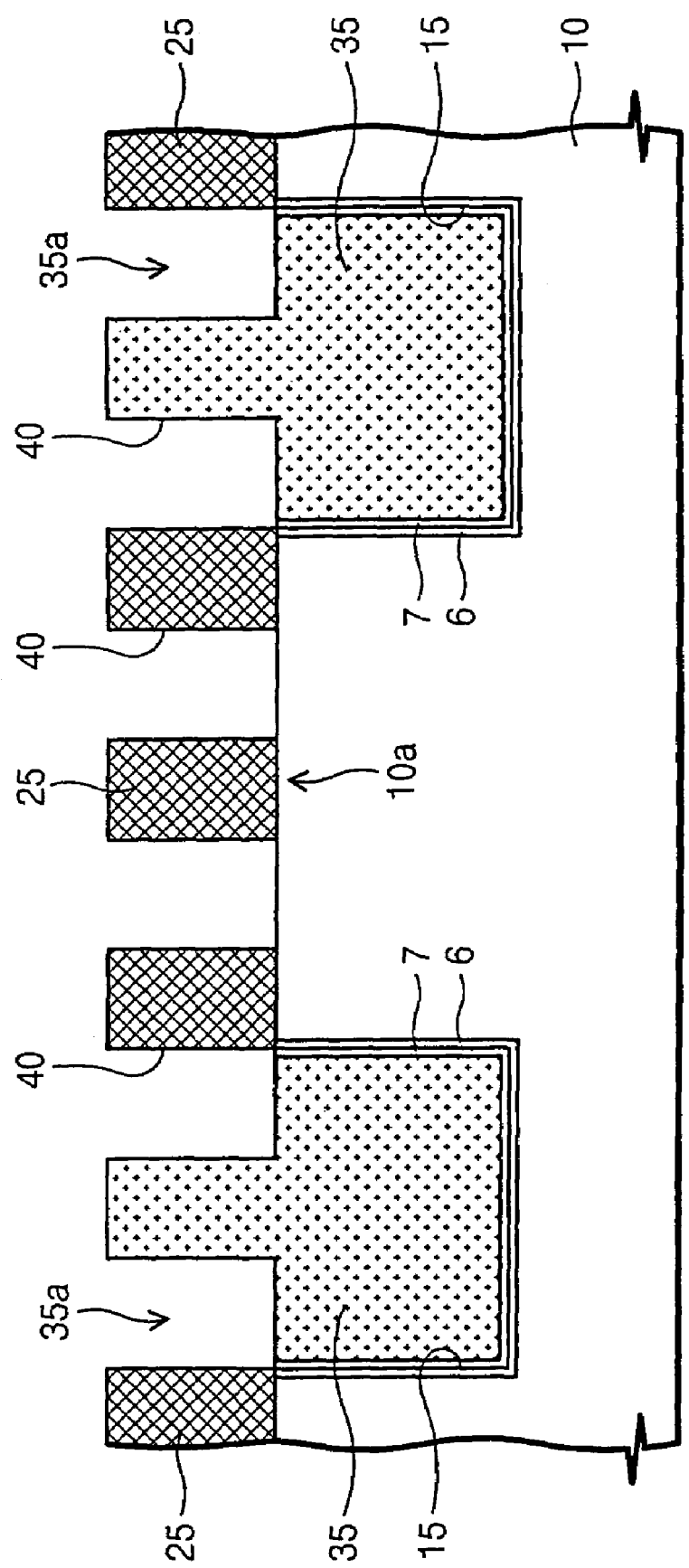
Figure 3C:
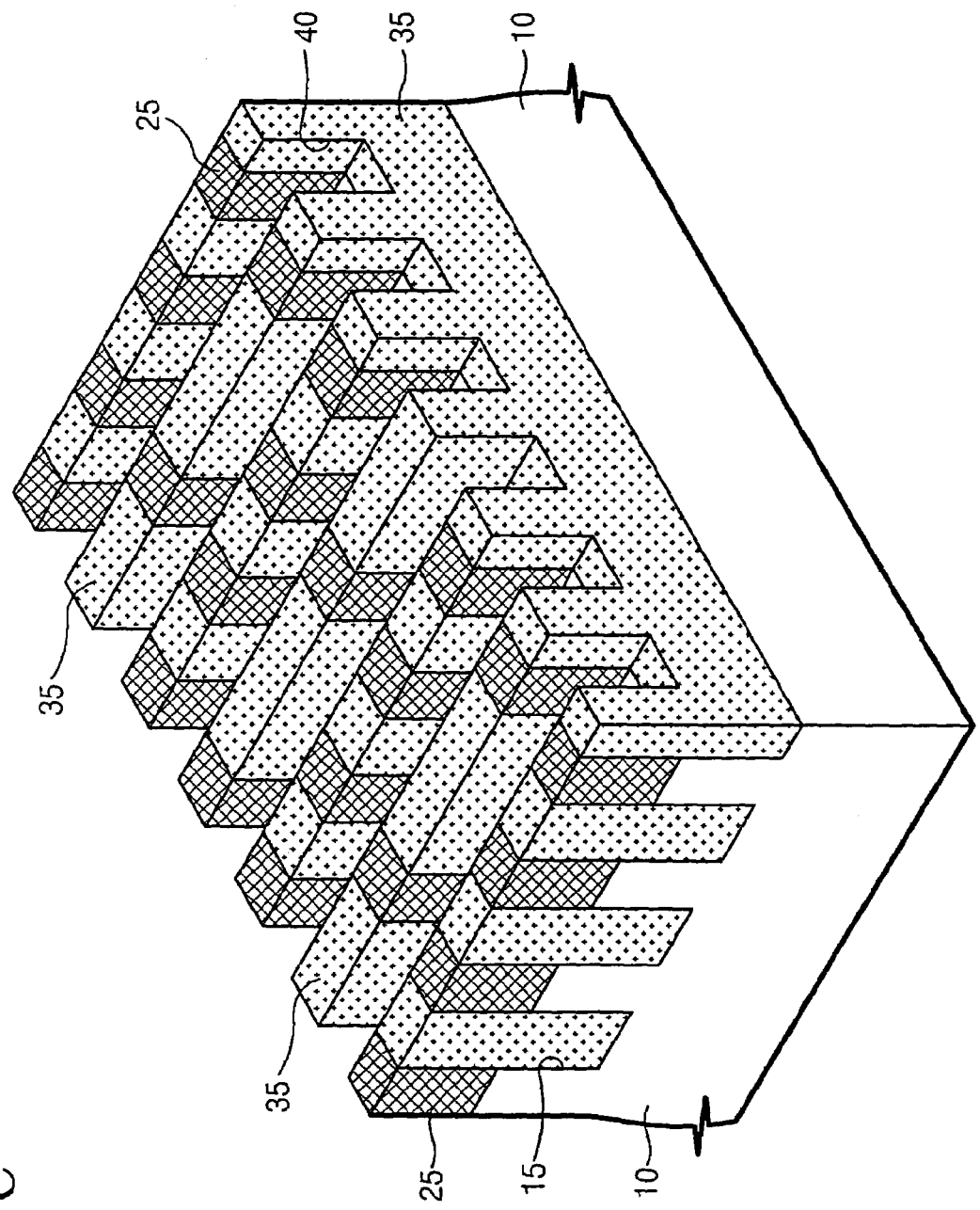

Referring to FIGS. 3A, 3B, and 3C, the trench masks 20 and the gap fill insulating layer 30 are patterned to form a trench mask pattern 25, which defines a slit-type opening 40 crossing the active region 10a, and a gap fill insulating pattern 35. Thus, the trench mask pattern 25 has a rectangular parallelepiped shape and is disposed on the active region 10a.

The slit-type opening 40 is formed by etching the trench masks 20 and the gap fill insulating layer 30 using an anisotropic etching process, until a top surface of the active region is exposed. Here, the etching process preferably adopts an etch recipe without an etch selectivity with respect to the trench mask 20 and the gap fill insulating layer 30, such that the two layers are etched at the same etch rate. Thus, the bottom of the slit-type opening 40 is about as high as the top surface of the active region 10a, on top of the trench 15. However, in the case that the etch recipe does have an etch selectivity with respect to the two layers 20 and 30, various conditions of the etching process should be preferably adjusted so as to planarize the entire bottom of the slit-type opening 40.

As described above, the slit-type opening 40 is formed to cross over the active region 10a and the trench 15 alike. Thus, the gap fill insulating pattern 35 has both high surfaces and low surfaces. That is, the gap fill insulating pattern 35 has an irregular surface. The low surface 35a corresponds to the bottom of the slit-type opening 40 formed over the trench 15.

Meanwhile, before forming the slit-type opening 40, an ion implantation process may be performed to form an impurity well (not shown) in the semiconductor substrate 10. The ion implantation process for forming the impurity well is capable of making various changes in the process order, in consideration of lattice defects and curing methods therefor.

Figure 4A:
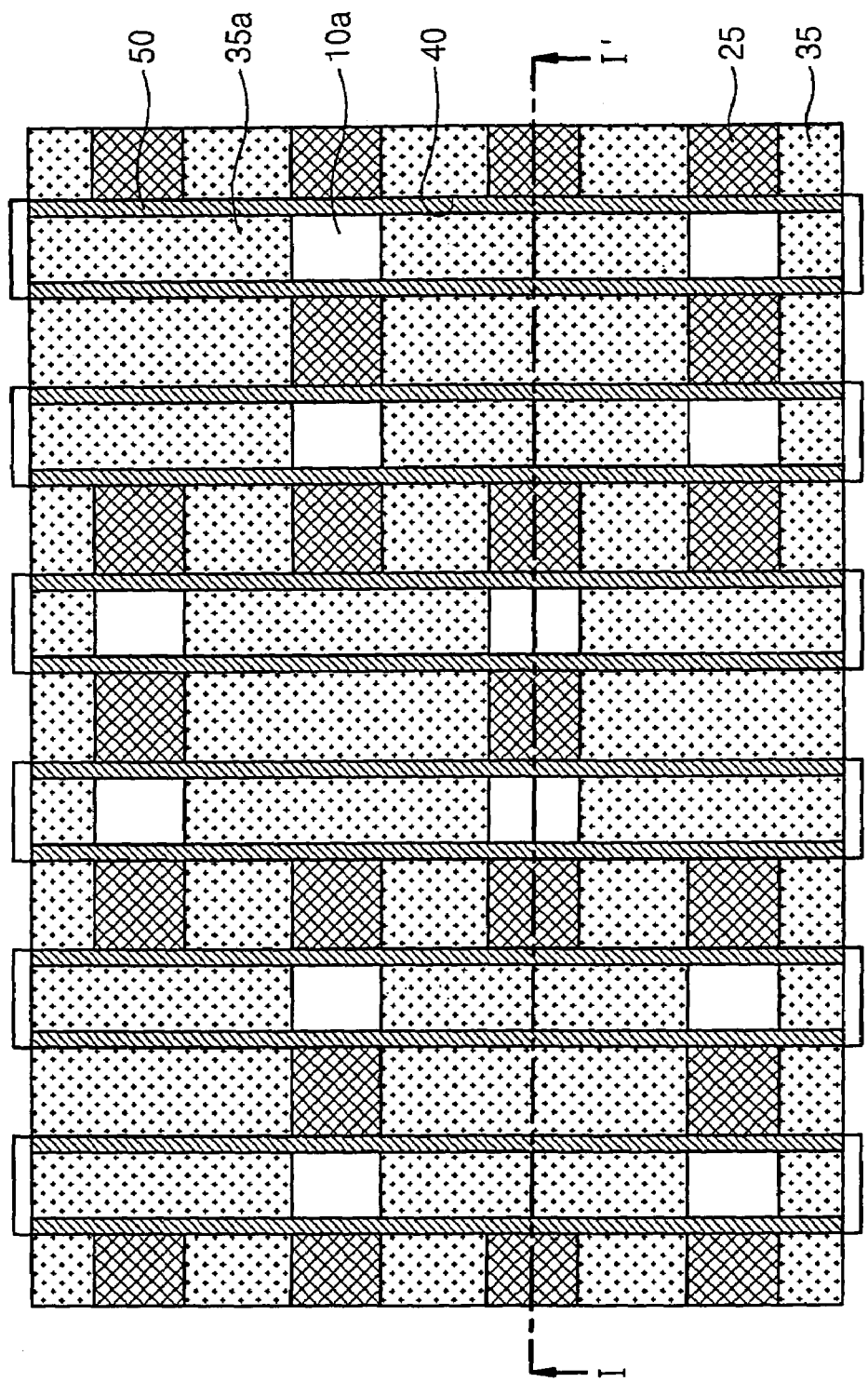
Figure 4B:
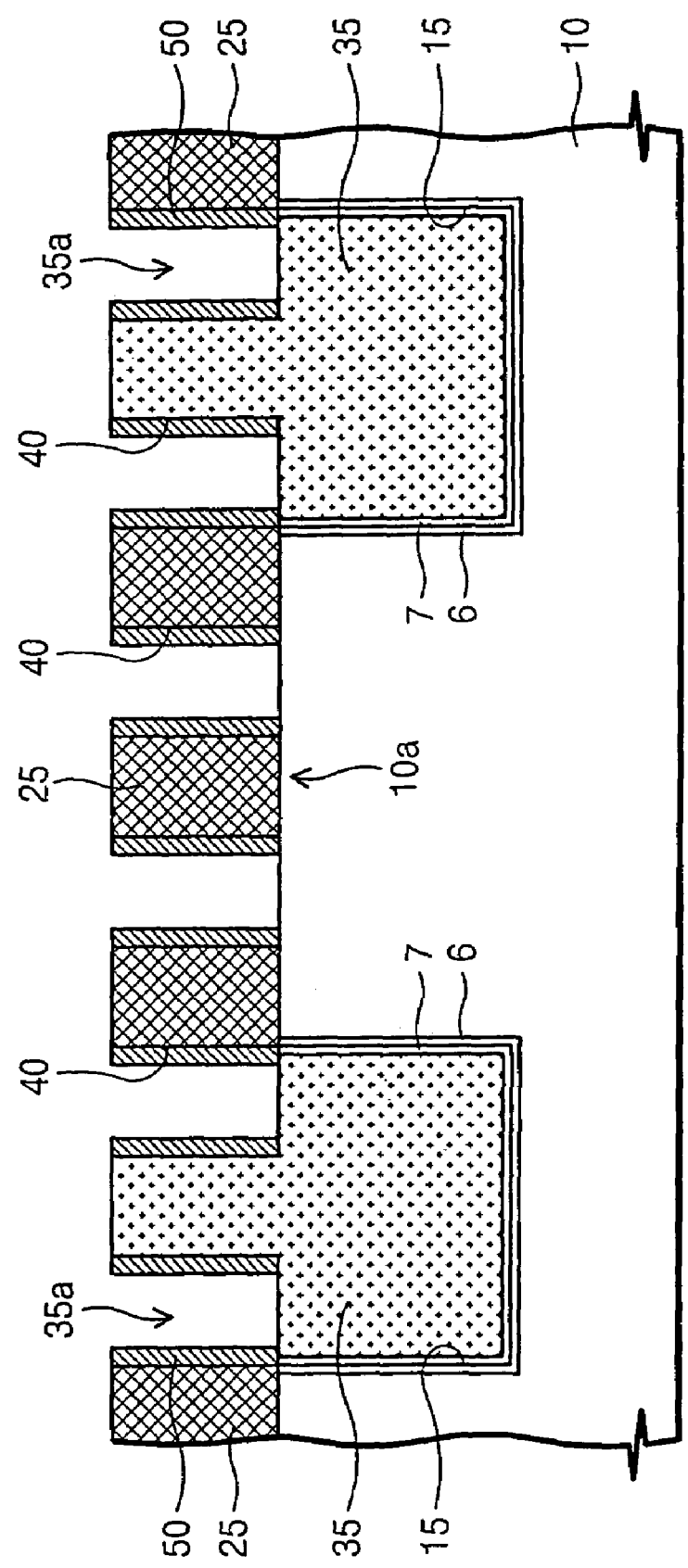
Figure 4C:
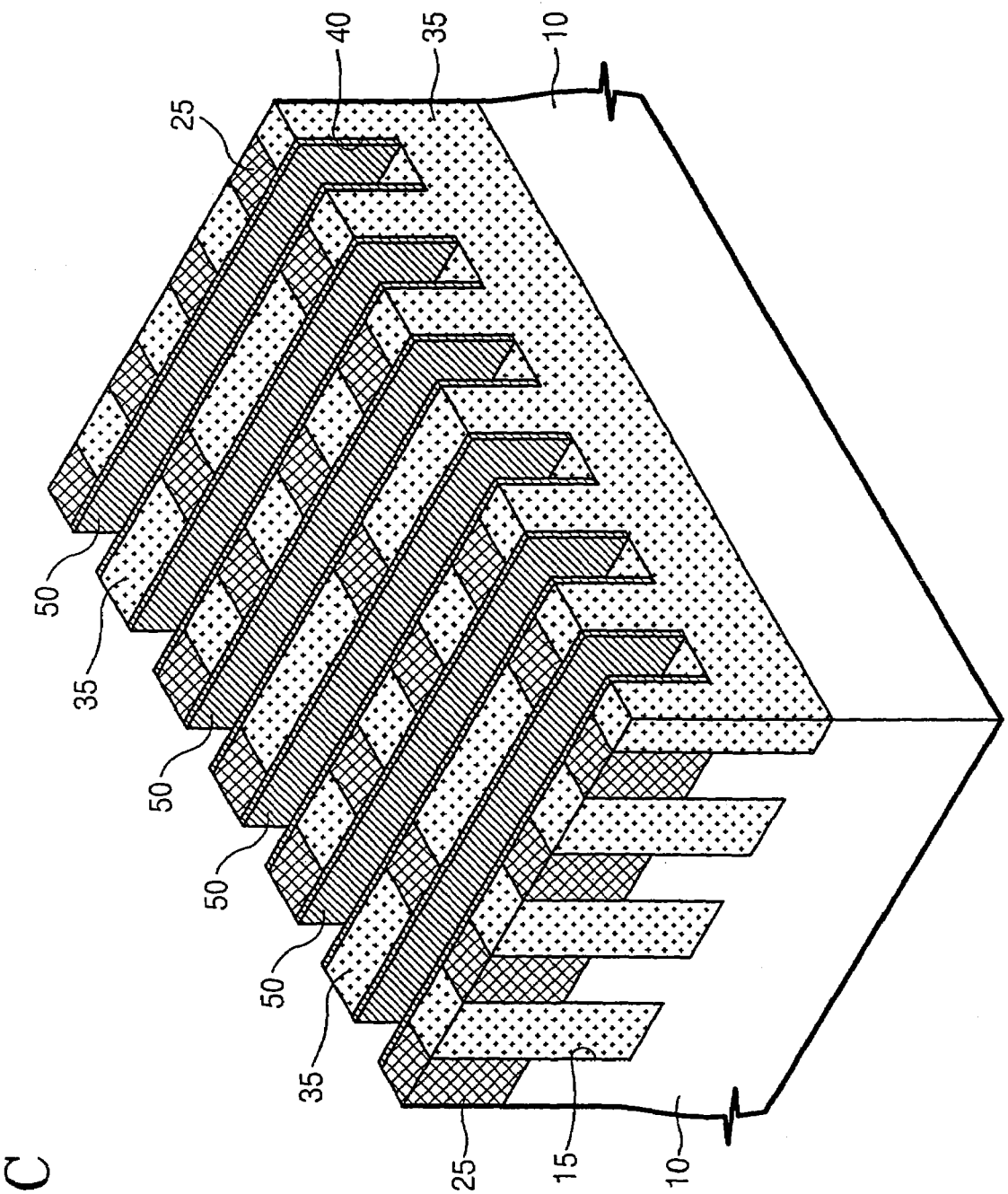

Referring to FIGS. 4A, 4B, and 4C, gate spacers 50 are formed on sidewalls of the slit-type opening 40.

To form the gate spacers 50, first, a gate spacer layer is conformally on the semiconductor substrate where the slit-type opening 40 is formed. Next, the gate spacer layer is anisotropically etched using an etch recipe having an etch selectivity with respect to the semiconductor substrate 10.

Here, the gate spacer layer is formed of a material layer having an etch selectivity with respect to the trench mask pattern 25, preferably a silicon oxide layer. Also, the gate spacer layer is formed using the anisotropic etching process to prevent etching damage of the gap fill insulating pattern 36.

Figure 5A:
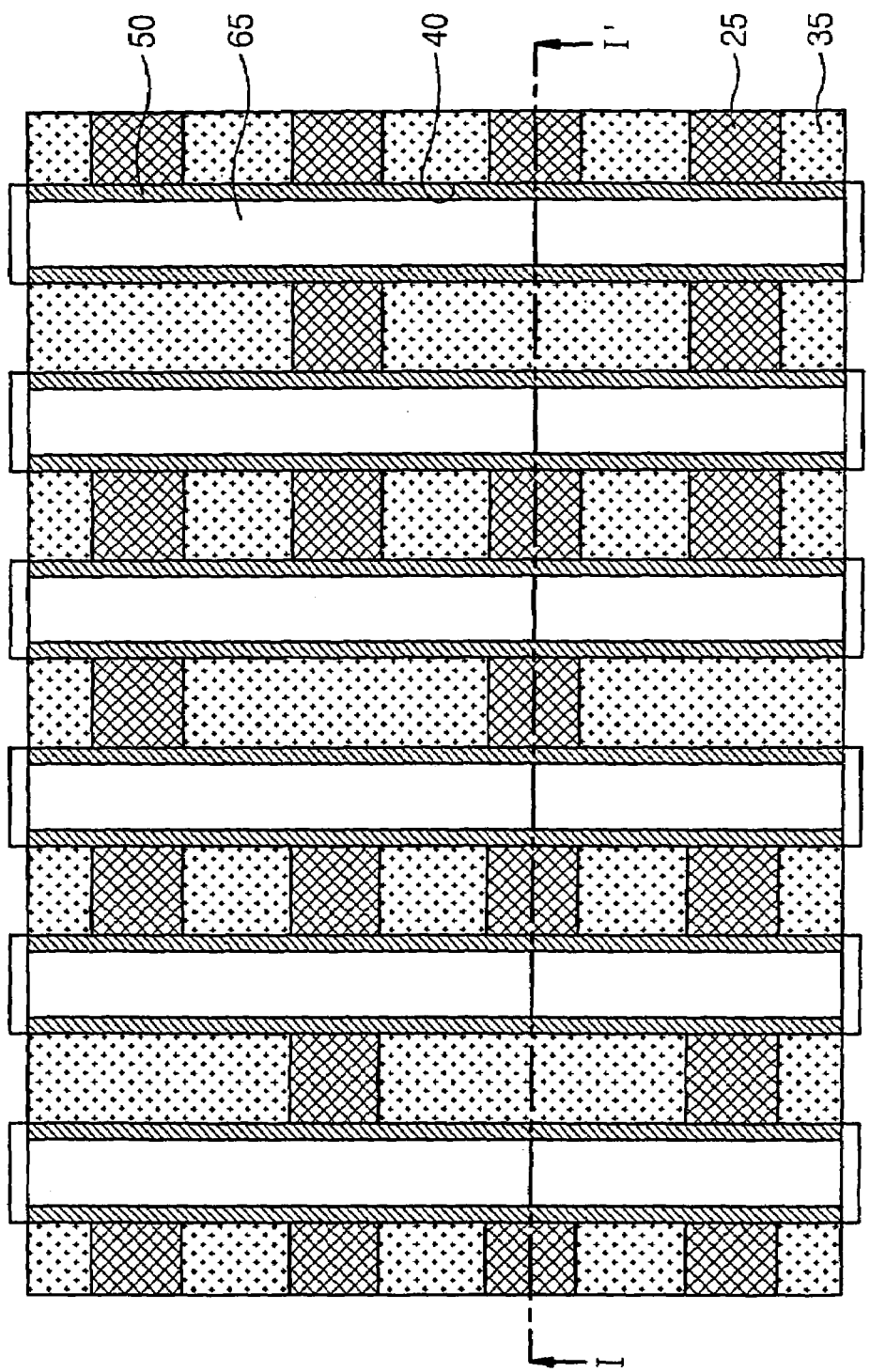
Figure 5B:
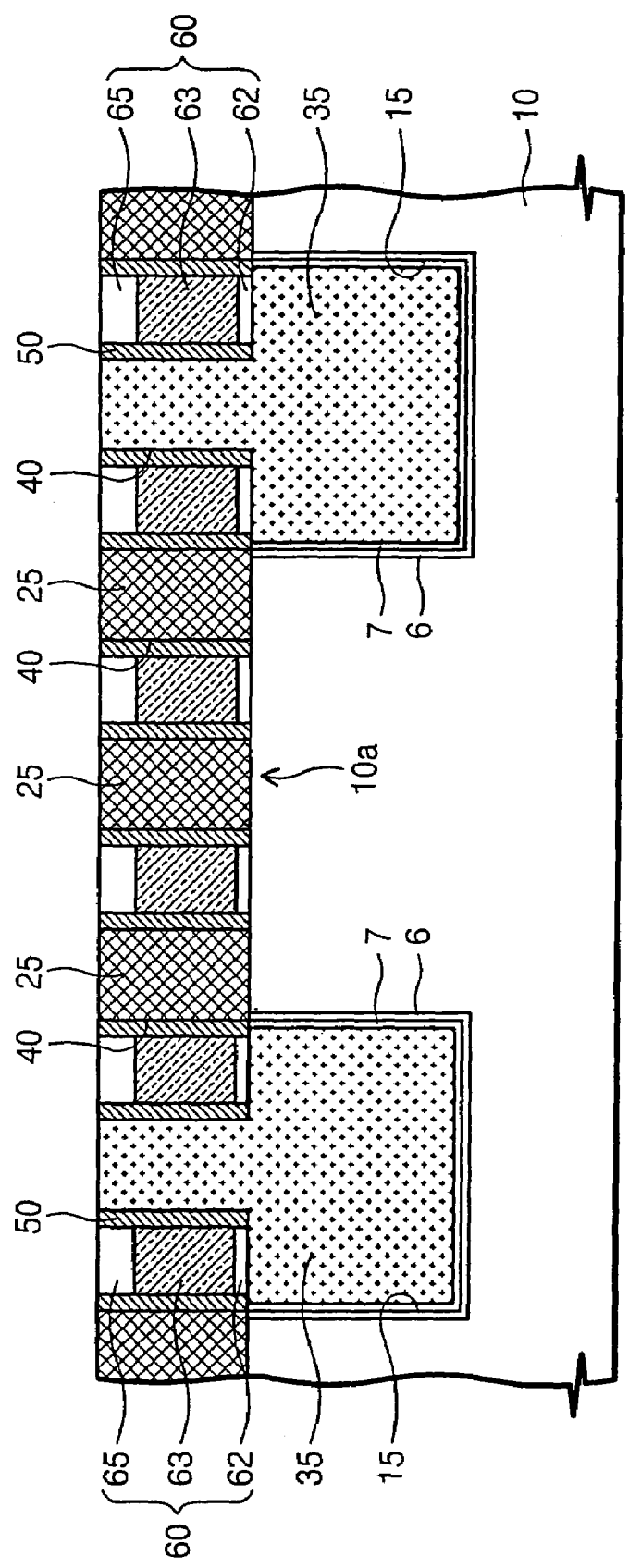
Figure 5C:
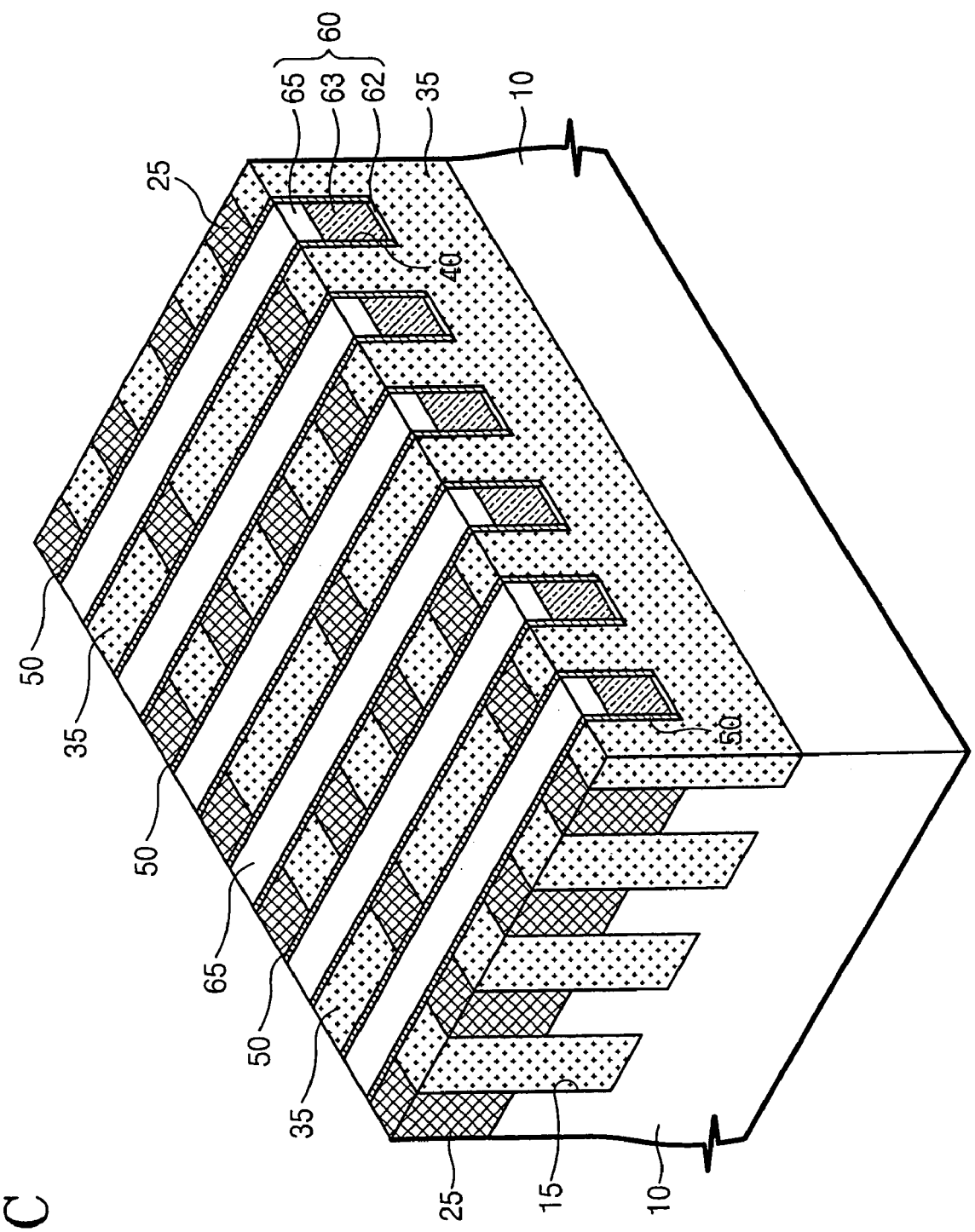

Referring to FIGS. 5A, 5B, and 5C, a gate pattern 60 is formed to fill the slit-type opening 40 where the gate spacers 50 are formed. The gate pattern 60 is preferably formed of a gate insulating layer 62, a gate conductive pattern 63, and a capping pattern 65, which are sequentially stacked.

The gate insulating layer 62 is preferably a silicon oxide layer obtained by thermally oxidizing the active region 10a exposed through the slit-type opening 40. Forming the gate conductive pattern 63 comprises stacking a gate conductive layer, filing the slit-type opening 40 on the entire surface of the semiconductor substrate where the gate insulating layer 62 is formed, and then etching back the gate conductive layer. Here, the etch back process is performed such that a top surface of the gate conductive pattern 63 becomes lower than the gate spacers 50. Also, the etch back process is carried out using an etch recipe having an etch selectivity with respect to the trench mask pattern 25, the gap fill insulating pattern 35, and the gate spacer 50. Also, the etch back process may be performed using an isotropic etching process or an anisotropic etching process. Further, before performing the etch back process, a process for planarizing the top surface of the gate conductive layer may be performed. The gate conductive pattern 63 is preferably a polysilicon layer and a tungsten layer, which are sequentially stacked. Here, both the polysilicon layer and the tungsten layer is preferably formed by sequentially performing the foregoing stacking and etching processes.

The capping pattern 65 is formed of a material having an etch selectivity with respect to the trench mask pattern 25. Thus, the capping pattern 65 is preferably formed of a silicon oxide layer like the gate spacers 50. Forming the capping pattern 65 comprises forming a capping layer on the entire surface of the semiconductor substrate including the gate conductive pattern 63, and then planarizing the capping layer until the trench mask pattern 25 is exposed. Thus, the capping pattern 65 is formed on the top surface of the gate conductive pattern 63, which is lower than the gate spacers 50 by a predetermined depth, as described above. The planarizing process may use CMP.

In the case of a gate pattern used for a flash memory device, a gate interlayer insulating layer and a gate upper conductive pattern may be further formed between the gate conductive pattern 63 and the capping pattern 65. Here, the gate interlayer insulating layer is preferably formed of an ONO layer. Also, the gate upper conductive pattern is preferably a polysilicon layer and a silicide layer, which are sequentially stacked. In this case, the gate conductive pattern 63 is preferably formed of polysilicon.

Forming the gate interlayer insulating layer and the gate upper conductive pattern comprises conformally forming the gate interlayer insulating layer on the entire surface of the semiconductor substrate including the gate conductive pattern 63. Next, a gate upper conductive layer is formed to fill the slit-type opening 40 where the gate interlayer insulating layer is formed. Then, the gate upper conductive layer is etched using an etch back process, thereby forming the gate upper conductive pattern having a top surface lower than the trench mask pattern 25. Thus, the gate interlayer insulating layer has a sidewall extension, which covers the sidewalls of the gate upper conductive pattern and the capping pattern 65. Then, the capping pattern 65 is formed by the foregoing method.

Figure 6A:
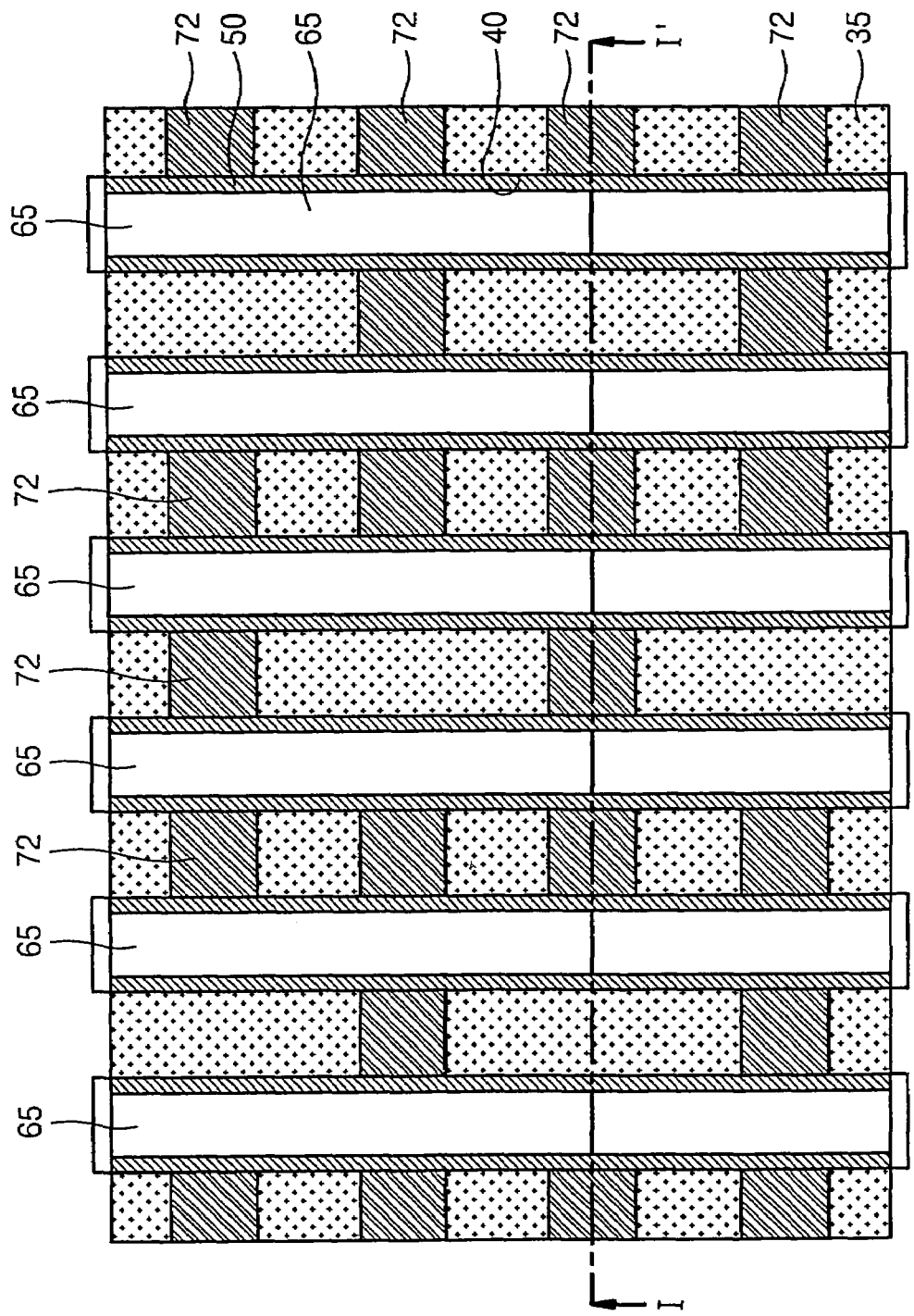
Figure 6B:
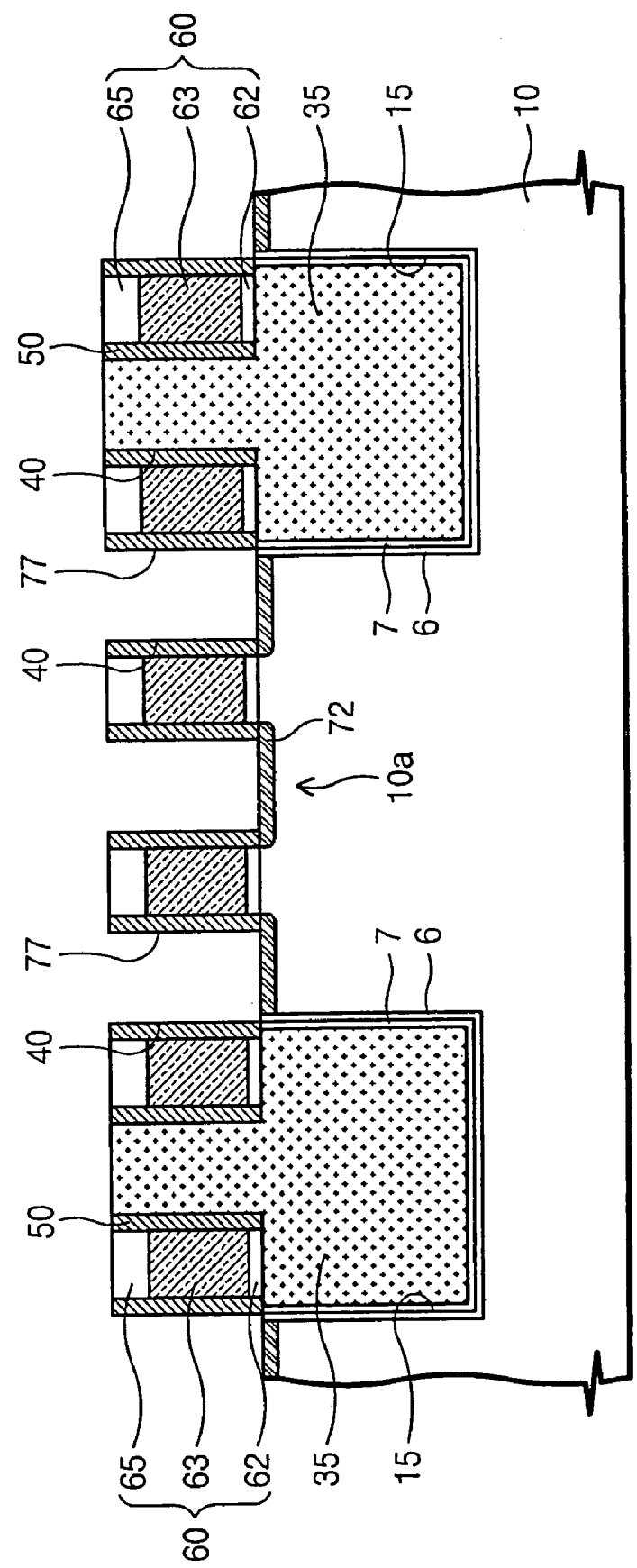
Figure 6C:
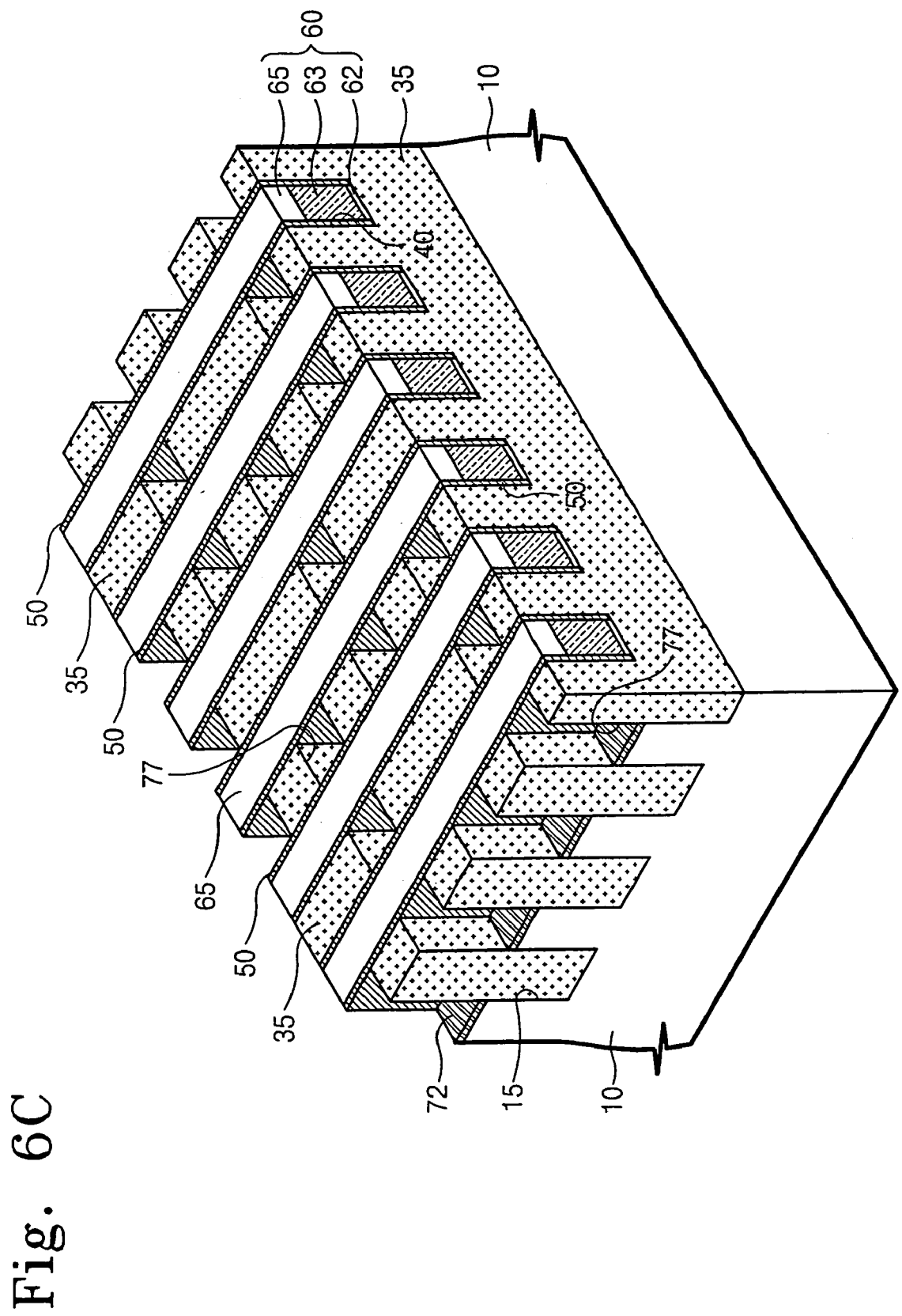

Referring to FIGS. 6A, 6B, and 6C, the trench mask pattern 25 is removed to form a contact opening 77 by exposing the active region 10*a* on both sides of the gate pattern 60. The trench mask pattern is removed using an etch recipe having an etch selectivity with respect to the gap fill insulating pattern 35, the gate spacer 50, and the semiconductor substrate 10. The removal process preferably uses an etchant containing phosphoric acid, but it may also use a dry etching process. Meanwhile, the gate conductive pattern 63 is surrounded by the capping pattern 65 and the gate spacer 50, which are formed of materials having an etch selectivity with respect to the etch recipe used for etching the trench mask pattern 25. Thus, the gate conductive pattern 63 can be prevented from having etching damage during the etching process.

After forming the contact opening 77, an ion implantation process is carried out using the gate pattern 60 and the gate spacers 50 as a mask, thereby forming a lightly doped region 72 in the exposed active region.

As described above, the trench mask pattern 25 has a rectangular parallelepiped shape, and the contact opening 77, which is obtained by removing the trench mask pattern 25, also has a rectangular parallelepiped shape. Accordingly, the lightly doped region 72 has a rectangular shape (see FIG. 6A). Also, when the trench mask pattern 25 is formed of a silicon oxide layer and a silicon nitride layer, which are sequentially stacked, the silicon oxide layer may not be removed during the etching process for forming the contact opening 77. In this case, the non-removed silicon oxide layer may be used as a buffer layer during the ion implantation process for forming the lightly doped region 72.

Figure 7A:
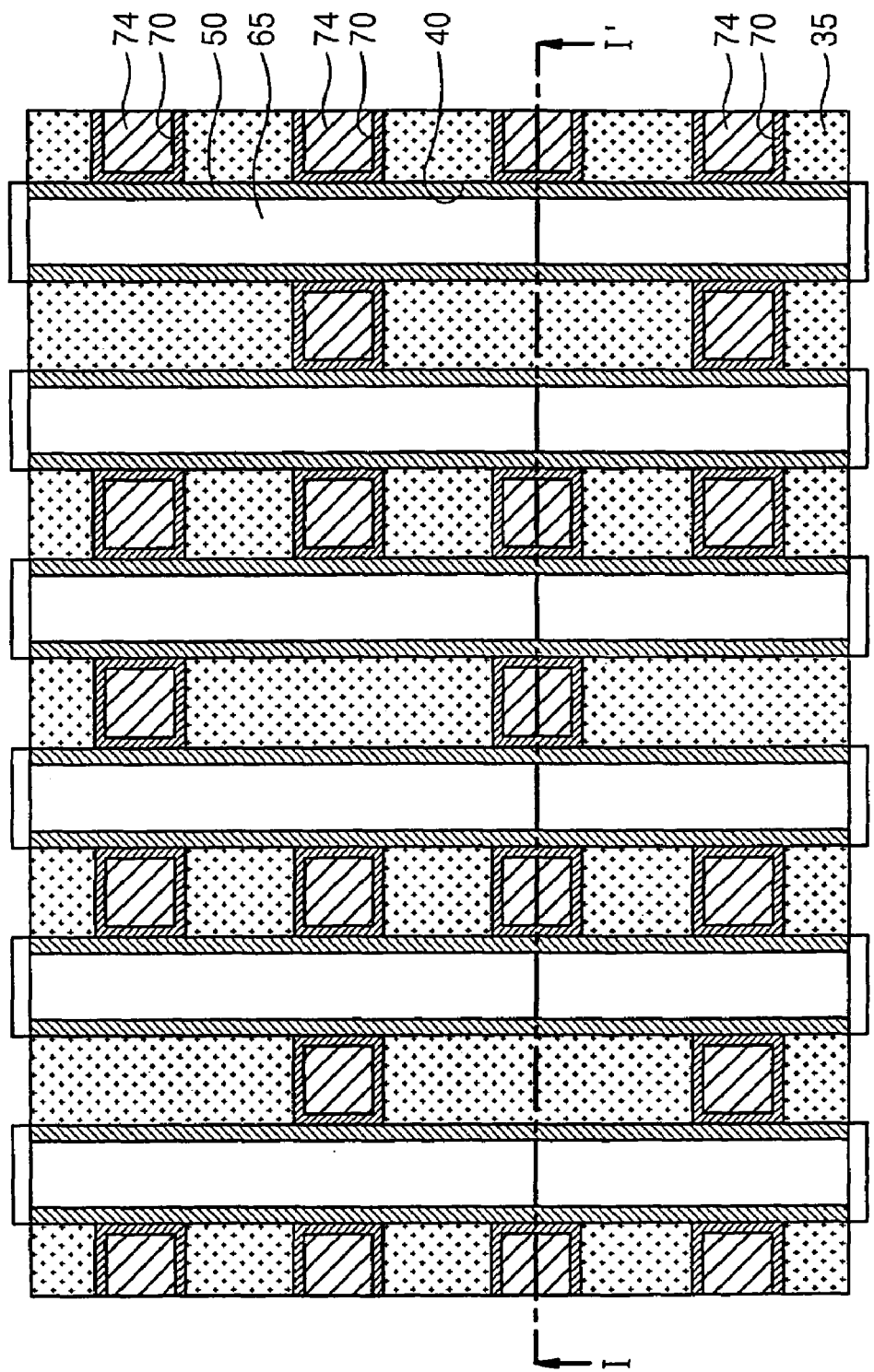
Figure 7B:
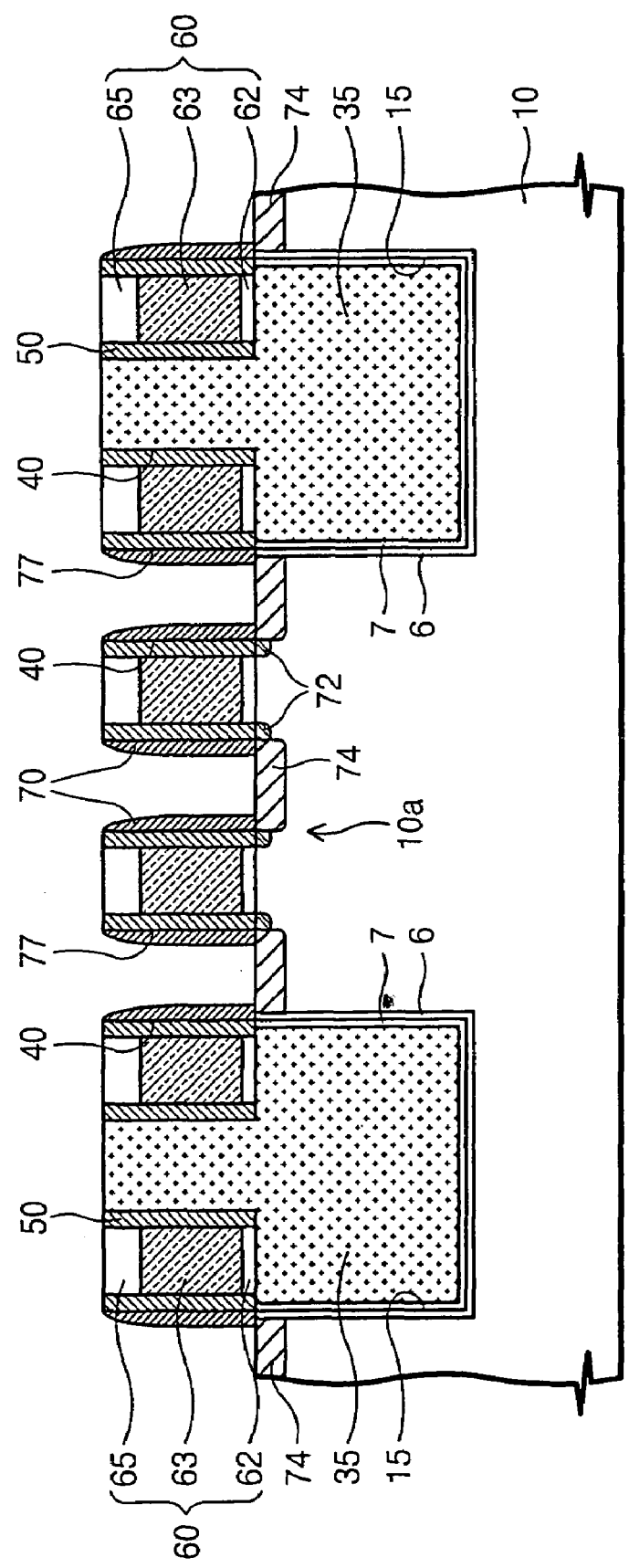
Figure 7C:
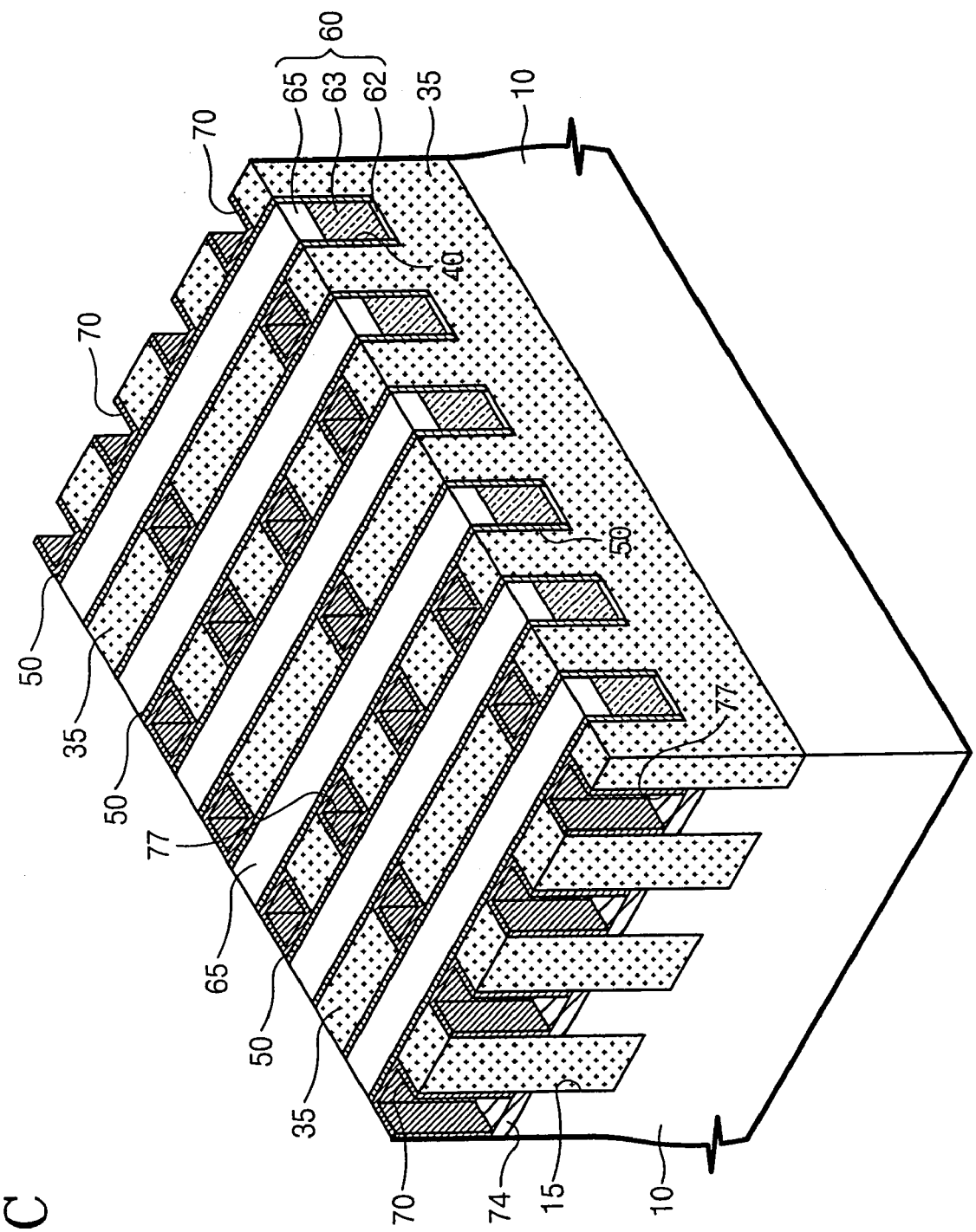

Referring to FIGS. 7A, 7B, and 7C, opening spacers 70 are formed on sidewalls of the contact opening 77. A high-concentration ion implantation process is carried out using the opening spacer 70 and the gate pattern 60 as a mask, thereby forming a heavily doped region 74 in the active region 10*a*. The heavily doped region 74 constitutes a lightly doped drain (LDD) junction region together with the lightly doped region 72.

The opening spacer 70 is preferably formed of one selected from the group consisting of a silicon nitride layer, a silicon oxide layer, and a silicon oxynitride layer. Here, as described above, if the silicon oxide layer included in the trench mask pattern 25 remains, the silicon oxide layer serves as an etch stop layer during the anisotropic etching process for forming the opening spacer 70. After forming the opening spacer 70, the remaining silicon oxide layer is removed to expose the active region 10*a*.

In addition, before forming the opening spacers 70, a wet etching process may be further performed to expand the width of the contact opening 77. The wet etching process is preferably carried out using the process of removing the trench mask pattern 25 or a typical cleaning process can be performed after forming the contact opening 77. Expanding the width of the contact opening 77 allows a subsequent process of forming a contact plug to be stably performed.

Figure 8A:
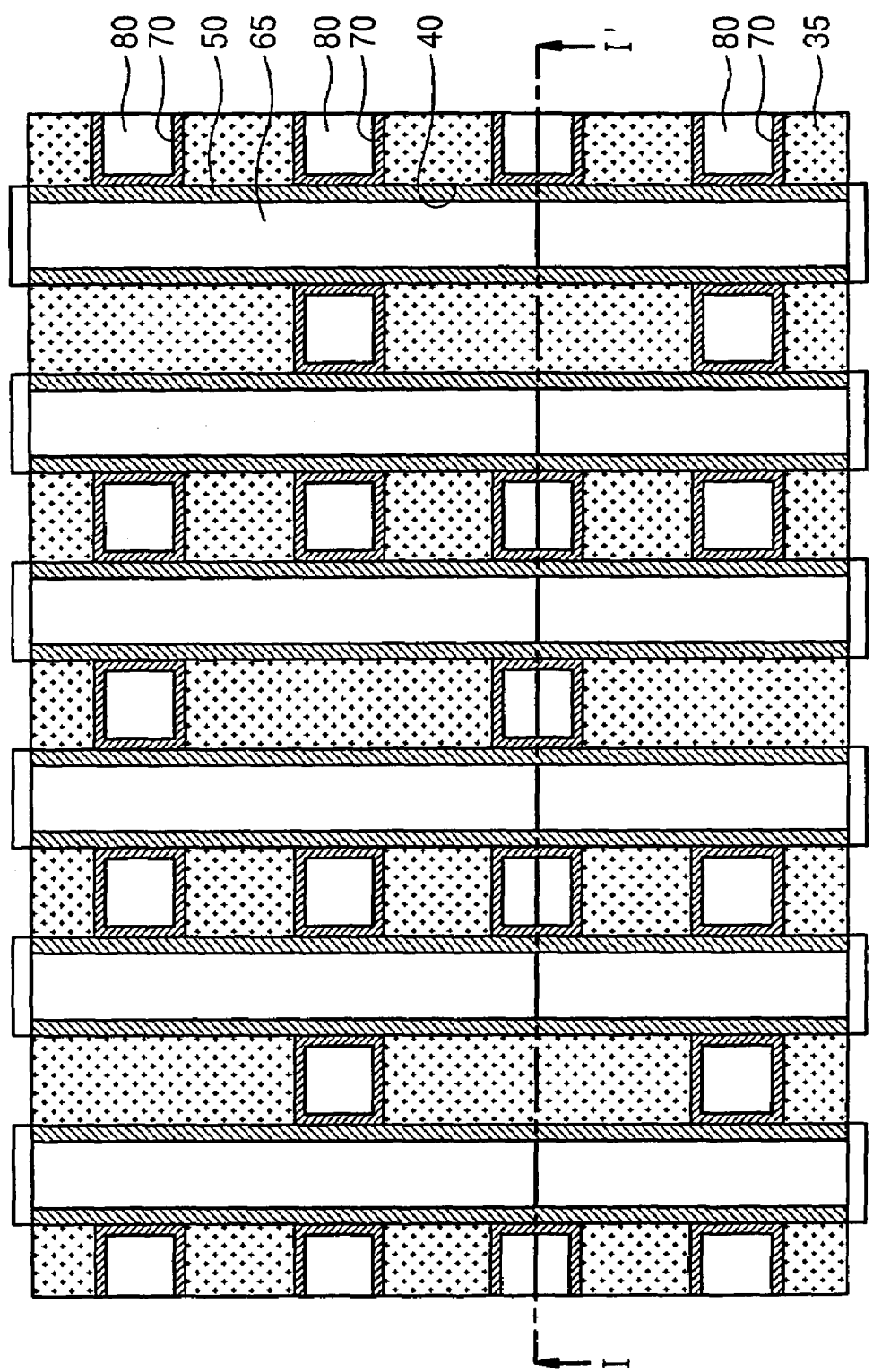
Figure 8B:
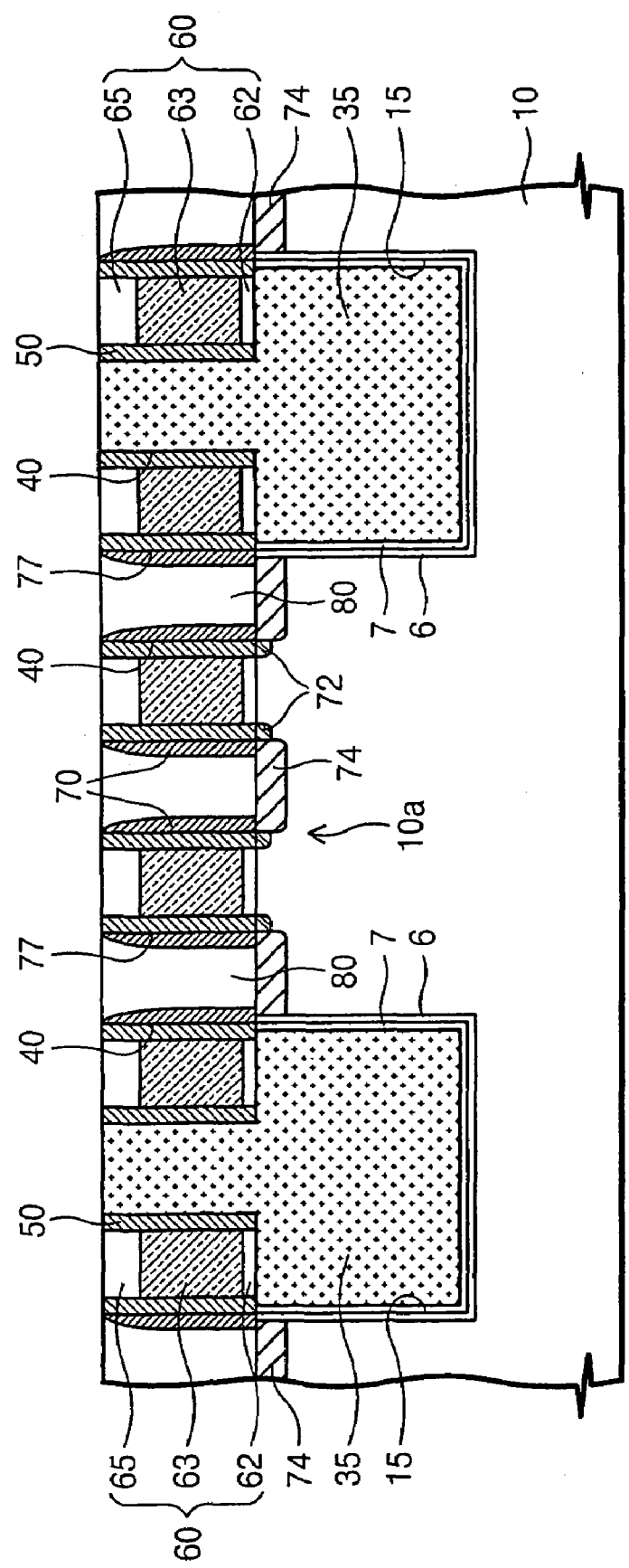
Figure 8C:
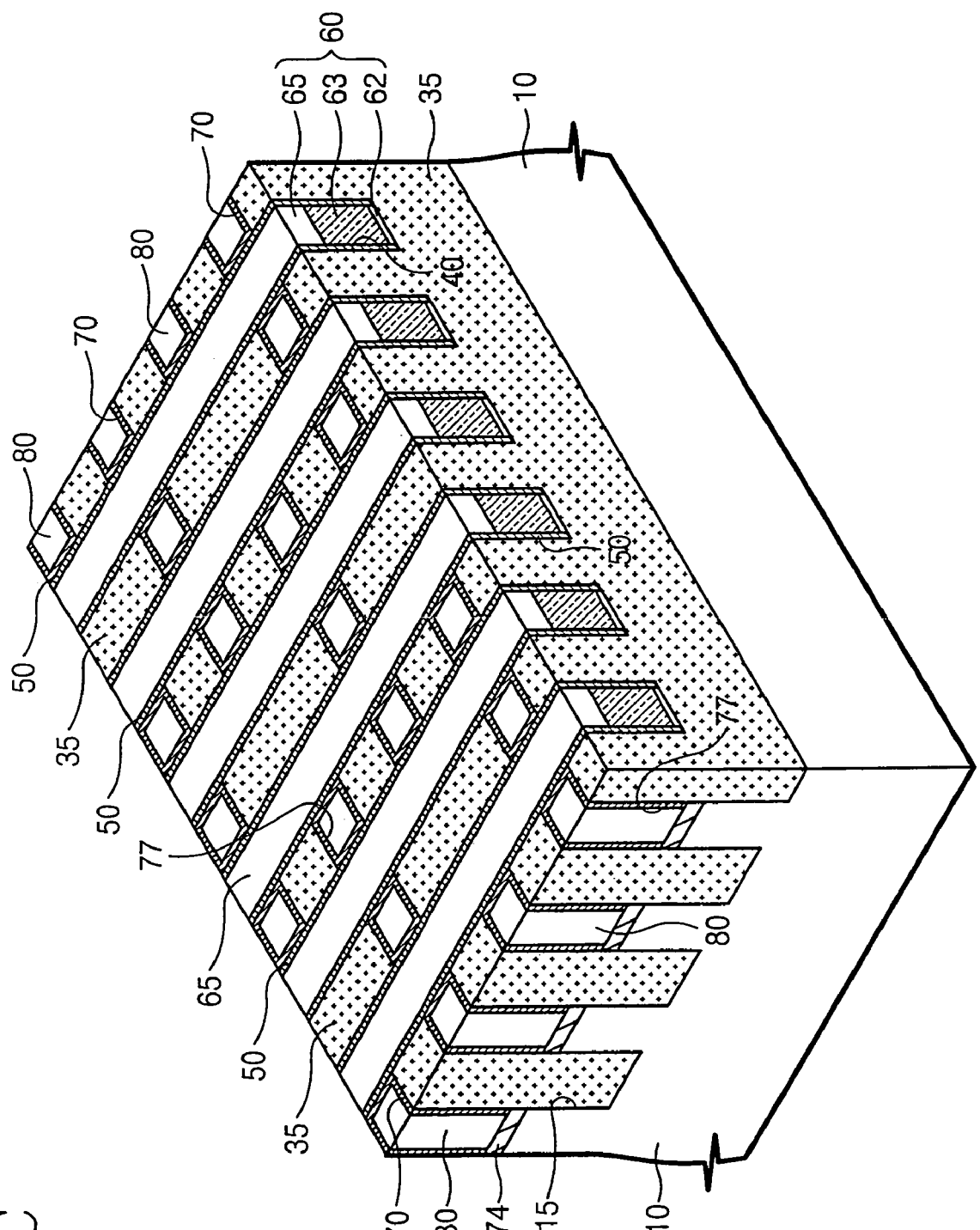

Referring to FIGS. 8A, 8B, and 8C, a contact plug 80 is formed to fill the contact opening 77 where the opening spacers 70 are formed.

The contact plug 80 is formed of at least one selected from the group consisting of conductive materials such as silicon, tungsten, titanium, titanium nitride, aluminum, and copper. Also, the contact plug 80 may be formed using CVD or physical vapor deposition (PVD). In more detail, by using the foregoing techniques, a contact plug conductive layer for filling the contact opening 77 is formed on the entire surface of the semiconductor substrate where the opening spacers 70 are formed. Next, the contact plug conductive layer is etched using the etch back process to expose the gap fill insulating pattern 35. Here, the etch back process is preferably performed using CMP.

Meanwhile, in a case where the contact plug 80 is formed of silicon, the epitaxial growth may be used in addition to the foregoing method. Here, the active region where the contact plug 80 will be formed is defined by the contact opening 77. Thus, the gap fill insulating pattern 35 and the opening spacers 70 separate the adjacent contact plugs 80 from each other. Accordingly, when the contact plug 80 is formed of silicon using epitaxial growth, a short circuit is not caused between adjacent contact plugs 80.

According to the present invention, the contact opening 77 is formed using an etch selectivity between different materials. The etch selectivity enables the contact opening 77 to be self-aligned to the gate pattern 60. Thus, the misalignment, which takes place in the conventional method using the photolithographic process, can be minimized. Also, as the contact opening 77 can have a rectangular parallelepiped shape, the rounding phenomenon caused by the photolithographic process can be substantially eliminated, and the width of the opening can be properly maintained.

Figure 9:
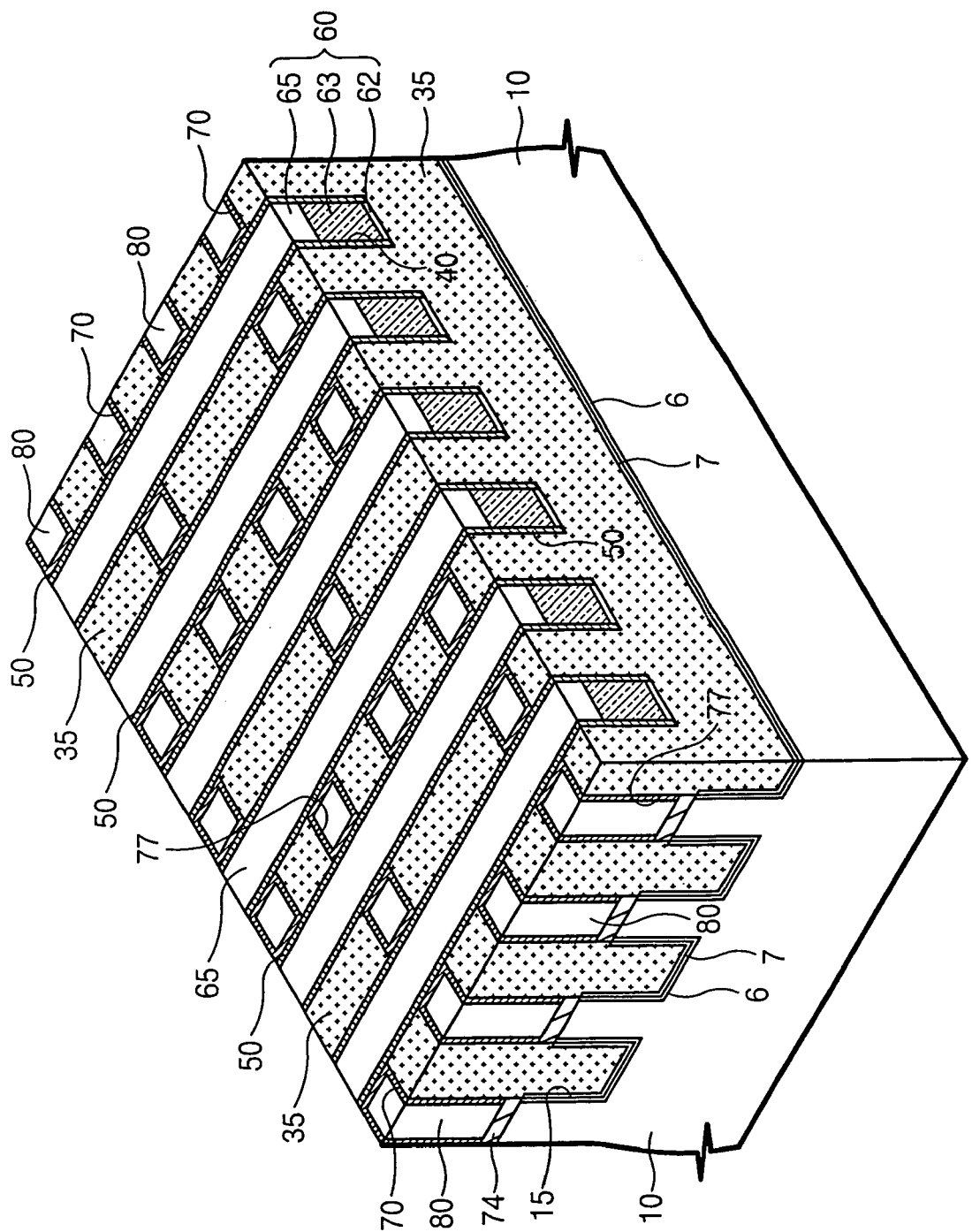
FIG. 9 is a perspective view of a semiconductor device according to an embodiment of the present invention.

FIG. 9 is a perspective view of a semiconductor device according to the preferred embodiment of the present invention.

Referring to FIG. 9, a trench 15 for defining an active region is disposed at a predetermined region of a semiconductor substrate 15. A trench thermal oxide layer 6 and a liner 7, which are sequentially stacked, cover inner walls of the trench 15. The trench thermal oxide layer 6 and the liner 7 are a silicon oxide layer and a silicon nitride layer, respectively.

The trench 15, in which the liner 7 is filled with a gap fill insulating pattern 35, is used as a device isolation layer. Thus, the gap fill insulating pattern 35 is preferably a silicon oxide layer. However, when the trench 15 has an aspect ratio, which makes it too difficult to fill the trench with a single silicon oxide layer, an SOG layer or a silicon epitaxial layer may be further disposed at the bottom region of the trench 15. If the silicon epitaxial layer is disposed, the bottoms of the trench thermal oxide layer 6 and the liner 7 are removed to expose a bottom of the trench 15.

A gate pattern 60 is disposed on the gap fill insulating pattern 35 to cross the active region and the trench. Here, a bottom of the gate pattern 60 is as high as a top surface of the active region. That is, the gate pattern 60 is in contact with the top surface of the active region. Also, the gate pattern 60 preferably has a planar bottom. The gate pattern 60 includes a gate insulating layer 62, a gate conductive pattern 63, and a capping pattern 65, which are sequentially stacked. The gate insulating layer 62 is preferably a silicon oxide layer formed on the active region. The gate conductive pattern 63 is formed of at least one selected from the group consisting of polysilicon and metals such as tungsten (W), cobalt (Co), and copper (Cu). The capping pattern 65 is preferably formed of the same chemical composition as the gap fill insulating pattern 35. Here, a top of the gap fill insulating pattern 35 is preferably as high as the top surface of the gate pattern 60. Thus, the gap fill insulating pattern 35 serves as an interlayer dielectric which insulates the adjacent gate patterns 60 from each other.

As the gap fill insulating pattern 35 is formed on the trench 15, it does not cover the active region. Accordingly, a contact opening 77 is formed to expose the active region between the gate pattern 60 and the gap fill insulating pattern 35. That is, the contact opening 77 is self-aligned to the gate patterns 60. Thus, the contact opening 77 is a vacancy of a rectangular parallelepiped shape, not a cylinder type like the conventional opening formed by the photolithographic and etching processes. As the contact opening 77 has the rectangular parallelepiped shape, the rounding phenomenon can be minimized during the patterning process including the photolithographic process. The rounding phenomenon causes edges of the opening to be rounded unlike the designed shape, thus decreasing the width of the opening.

The contact opening 77 is filled with a contact plug 80. Opening spacers 70 are disposed on the sidewalls of the contact opening 77 to electrically insulate the contact plug 80 from the gate pattern 60. The contact plug 80 is formed of at least one selected from the group consisting of silicon (Si), tungsten (W), titanium (Ti), titanium nitride (TiN), and aluminum (Al). Here, the silicon layer is preferably an epitaxial silicon layer containing impurities or a polysilicon layer. Also, the opening spacers 70 include at least one selected from the group consisting of a silicon nitride layer, a silicon oxide layer, and a silicon layer.

A junction region, which is an LDD structure including a lightly doped region 72 and a heavily doped region 74, is formed in the active region under the contact opening 77. Also, gate spacers 50 are disposed on the sidewalls of the gate pattern 60. The gate spacers 50 are formed of the same chemical composition as the gap fill insulating pattern 35, preferably a silicon oxide layer. Further, the gate spacers 50 preferably have the same shape as typical spacers formed using an anisotropic etch process. Thus, sidewalls contacting the gate pattern 60 may have a bent shape. In this case, the gate pattern 60 has a bottom region wider than the top region.

The gate pattern 60 may be a gate pattern used for a flash memory device. In this case, a gate interlayer insulating layer and a gate upper conductive pattern, which are sequentially stacked, may be further disposed between the gate conductive pattern 63 and the capping pattern 65. The gate interlayer insulating layer may be an ONO layer. Here, the gate interlayer insulating layer has a sidewall extension which covers the sidewalls of the gate upper conductive pattern and the capping pattern 65. Also, the gate upper conductive pattern is preferably a polysilicon layer and a silicide layer, which are sequentially stacked.

According to the present invention, the contact opening is formed by using an etch selectivity between different materials. In the case of using the etch selectivity, the contact opening is self-aligned to the gate pattern. Thus, the misalignment, which takes place when the contact opening is formed by using photolithographic process, can be minimized. As a result, semiconductor devices can be highly integrated.

Also, according to the present invention, the contact opening is self-aligned to the gate pattern and has a rectangular parallelepiped shape. Accordingly, the rounding phenomenon can be minimized and thus the width of the opening can be properly maintained. As a result, semiconductor devices can be highly integrated.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor substrate comprising:
   a semiconductor substrate where a trench for defining an active region is formed;
   a gap fill insulating pattern filled in the trench and having a contact opening exposing the active region; and
   a contact plug formed in the contact opening and connected to the active region,
   wherein the contact opening is a rectangular parallelepiped vacancy.

2. The device as claimed in claim 1, wherein the gap fill insulating pattern comprises a silicon oxide layer.

3. The device as claimed in claim 1, further comprising a gate pattern disposed in the slit-type opening extending across the active region and the trench, wherein the slit-type opening is bounded by the gap fill insulating pattern and the contact plug.

4. The device as claimed in claim 3, wherein the top surface of the gate pattern is as high as the top of the gap fill insulating pattern.

5. The device as claimed in claim 3, wherein the gate pattern is a gate insulating layer, a gate conductive pattern and a capping pattern, which are sequentially stacked.

6. The device as claimed in claim 5, wherein the capping pattern has substantially the same chemical composition as the gap fill insulating pattern.

7. The device as claimed in claim 3, further comprising gate spacers disposed on sidewalls of the gate pattern to separate the gate pattern from the contact plug and the gap fill insulating pattern.

8. The device as claimed in claim 5, further comprising a gate interlayer insulating layer and a gate upper conductive pattern, which are sequentially stacked, between the gate conductive pattern and the capping pattern.

9. The device as claimed in claim 8, wherein the gate interlayer insulating layer is an oxide-nitride-oxide layer.

10. The device as claimed in claim 8, wherein the gate interlayer insulating layer further has a sidewall extension that covers sidewalls of the gate upper conductive pattern.

11. The device as claimed in claim 5, wherein the gate conductive pattern is formed of at least one of polysilicon and a metal.

12. The device as claimed in claim 1, wherein the contact plug is one of an epitaxial silicon layer and a polysilicon layer.

13. The device as claimed in claim 1, further comprising opening spacers disposed between sidewalls of the contact opening and the contact plug.

14. The method as claimed in claim 1, further comprising an epitaxial silicon layer or a SOG layer at the bottom of the trench.

* * * * *